（12） United States Patent
Kon et al.

(10) Patent No.: US 9,800,225 B2
(45) Date of Patent: Oct. 24, 2017

(54) ELASTIC WAVE DEVICE

(71) Applicant: RIVER ELETEC CORPORATION, Yamanashi (JP)

(72) Inventors: Tasuku Kon, Yamanashi (JP); Katsuya Mizumoto, Yamanashi (JP)

(73) Assignee: RIVER ELETEC CORPORATION, Yamanashi (JP)

( * ) Notice: Subject to any disclaimer, the term of this patent is extended or adjusted under 35 U.S.C. 154(b) by 0 days.

(21) Appl. No.: 14/901,584

(22) PCT Filed: Jun. 26, 2014

(86) PCT No.: PCT/JP2014/066981
§ 371 (c)(1),
(2) Date: Dec. 28, 2015

(87) PCT Pub. No.: WO2014/208664
PCT Pub. Date: Dec. 31, 2014

(65) Prior Publication Data
US 2016/0204760 A1    Jul. 14, 2016

(30) Foreign Application Priority Data

Jun. 28, 2013  (JP) .................. 2013-135672
Jun. 28, 2013  (JP) .................. 2013-135673
Jun. 28, 2013  (JP) .................. 2013-135675

(51) Int. Cl.
  *H03H 9/02*  (2006.01)
  *H03H 9/145*  (2006.01)
  *H03H 9/17*  (2006.01)

(52) U.S. Cl.
  CPC .... *H03H 9/02622* (2013.01); *H03H 9/02228* (2013.01); *H03H 9/02551* (2013.01);
  (Continued)

(58) Field of Classification Search
  CPC ........... H03H 9/02551; H03H 9/02834; H03H 9/145; H03H 9/171
  (Continued)

(56) References Cited

U.S. PATENT DOCUMENTS

2004/0135469 A1*  7/2004  Kanna ............... H03H 9/02834
                                                              310/313 A
2006/0152107 A1     7/2006  Tanaka
                    (Continued)

FOREIGN PATENT DOCUMENTS

CN        1801612 A      7/2006
CN        1943109 A      4/2007
                    (Continued)

OTHER PUBLICATIONS

Extended European Search Report for Application No. EP14817110.1, dated Jun. 9, 2016.
(Continued)

*Primary Examiner* — Derek Rosenau
(74) *Attorney, Agent, or Firm* — Browdy and Neimark, PLLC

(57)  ABSTRACT

An elastic wave device is provided that has an phase velocity optimum for a high-frequency oscillation as well as a preferred frequency temperature behavior that exhibits a cubic curve by utilizing a rotated Y-cut quartz crystal substrate with novel Euler angles of rotation. The elastic wave device includes a quartz crystal substrate and an excitation-electrode. The quartz crystal substrate is cut out from a quartz crystal body that has a particular three-dimensional crystallite orientation. The quartz crystal substrate is cut at rotation angles specified by right-handed Euler-angles. The excitation-electrode generates a plurality of plate waves on a front surface of the quartz crystal substrate. The quartz crystal substrate is cut at rotation
(Continued)

11: elastic wave device
12: quartz crystal substrate
13: excitation-electrode angles in a given range. The selected vibration mode of the quartz crystal substrate is a plate wave having a primary and a secondary temperature coefficient in given ranges with Taylor expansion performed at a particular temperature.

11 Claims, 23 Drawing Sheets

(52) U.S. Cl.
CPC ........ *H03H 9/02834* (2013.01); *H03H 9/145* (2013.01); *H03H 9/171* (2013.01)

(58) Field of Classification Search
USPC ..... 310/313 R, 313 A, 313 B, 313 C, 313 D, 310/360, 361
See application file for complete search history.

(56) References Cited

U.S. PATENT DOCUMENTS

| | | | | |
|---|---|---|---|---|
| 2007/0188047 | A1* | 8/2007 | Tanaka | H03H 9/02228 310/313 D |
| 2007/0194657 | A1 | 8/2007 | Morita et al. | |
| 2010/0102668 | A1* | 4/2010 | Nakagawa | H03H 9/02551 310/313 A |
| 2010/0102669 | A1 | 4/2010 | Yamanaka | |
| 2010/0244626 | A1* | 9/2010 | Yamanaka | H03H 9/02551 310/313 B |
| 2011/0018389 | A1* | 1/2011 | Fukano | H03H 9/059 310/313 R |
| 2011/0266918 | A1 | 11/2011 | Iwamoto et al. | |
| 2012/0062069 | A1* | 3/2012 | Yamanaka | H03H 9/02551 310/313 A |

FOREIGN PATENT DOCUMENTS

| | | |
|---|---|---|
| EP | 1732216 A1 | 12/2006 |
| JP | 5768925 A | 4/1982 |
| JP | 59210708 A | 11/1984 |
| JP | 2002152007 A | 5/2002 |
| JP | 2003258596 A | 9/2003 |
| JP | 4465464 A | 9/2005 |
| JP | 4306668 A | 8/2006 |
| JP | 2006217566 A | 8/2006 |
| JP | 200809874 A | 4/2008 |
| JP | 2010103803 A | 5/2010 |
| JP | 2011171888 A | 9/2011 |
| JP | 2011259348 A | 12/2011 |
| WO | 2005099089 A1 | 10/2005 |
| WO | 20100082571 A1 | 7/2010 |

OTHER PUBLICATIONS

Bechmann et al., "Higher Order Temperature Coefficients of the Elastic Stiffness and Compliances of Alpha-Quartz," United States Army, Electronics Research and Development Laboratory, Fort Monmouth, NJ, AD426194 Defense Documentation Center for Scientific and Tactical Information, Cameron Station, Alexandria, VA (1963).
"Basic Technology of Quartz Crystal Resonators," Fortiming Corp., downloaded in 2016 at www.4timing.com/chcrystal.htm.
Temperature coefficient, downloaded from Wikipedia at: https://en.wikipedia.org/wiki/Temperature_coefficient (2016).
European Search Report for Application No. EP14817110.1, dated Jun. 9, 2016.
European Office Action for Application No. EP14817110.1 dated May 11, 2017.

* cited by examiner

[FIG. 1]
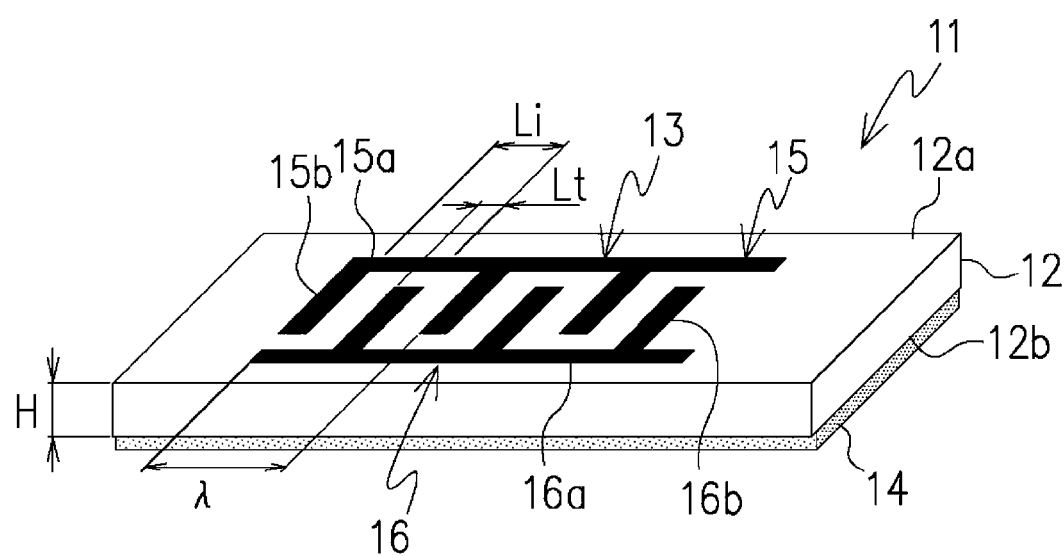
11: elastic wave device
12: quartz crystal substrate
13: excitation-electrode

[FIG. 2]
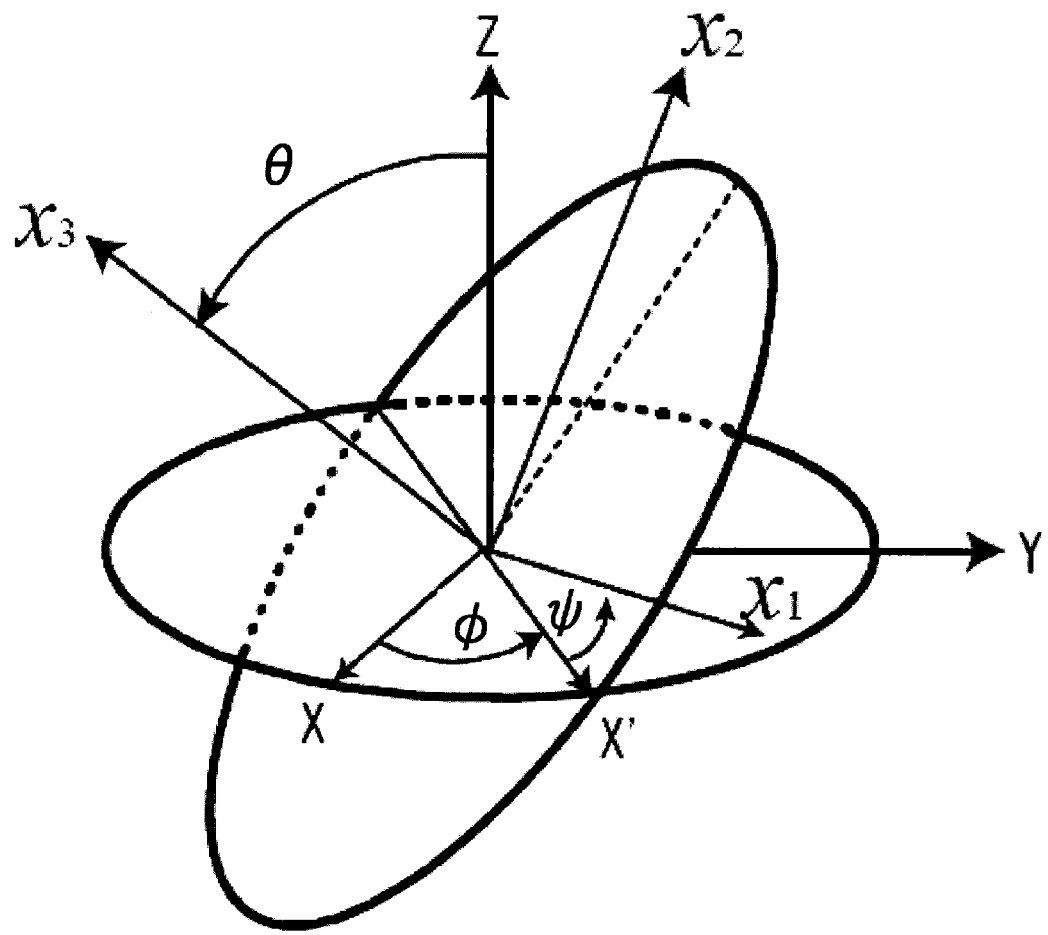

[FIG. 3]
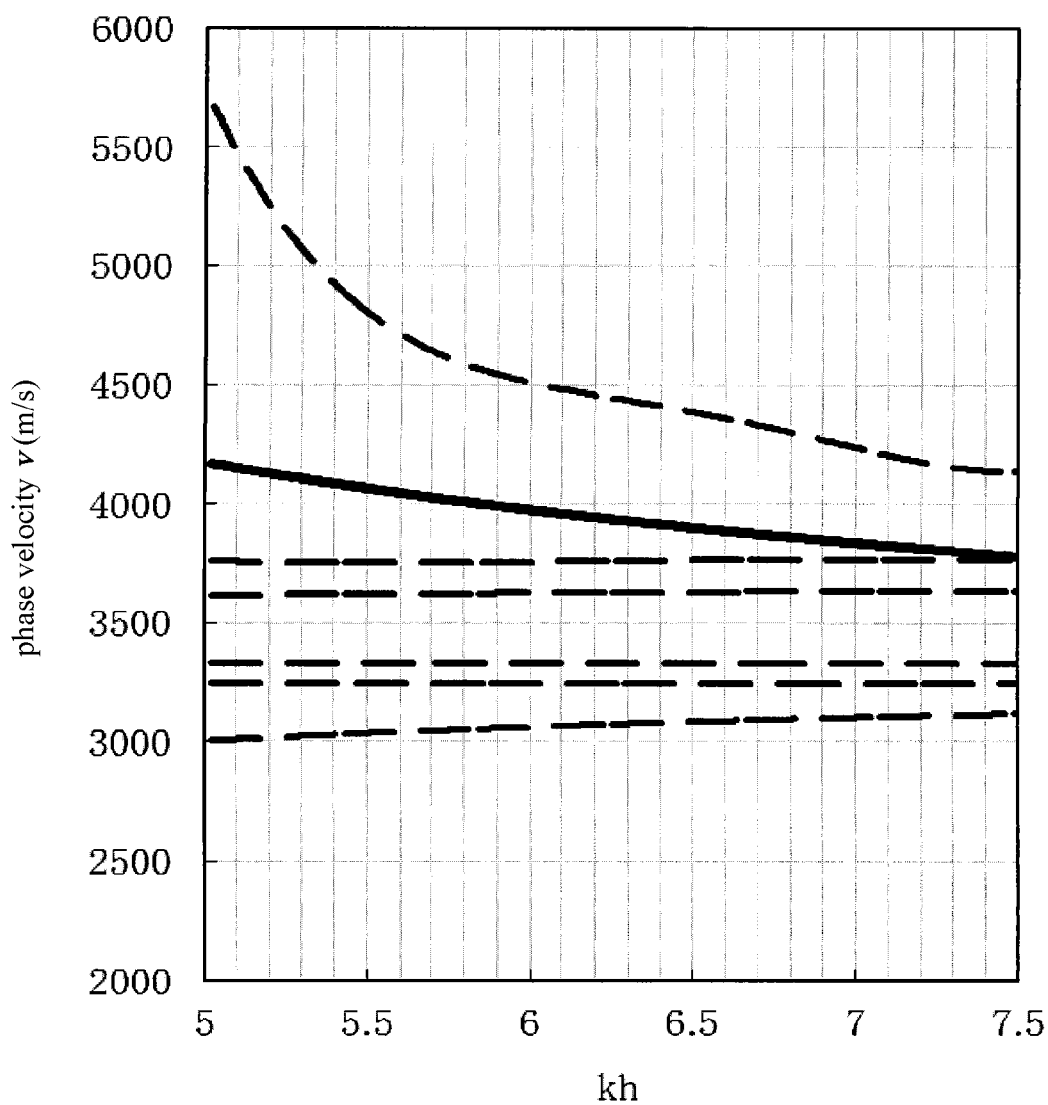

[FIG. 4]
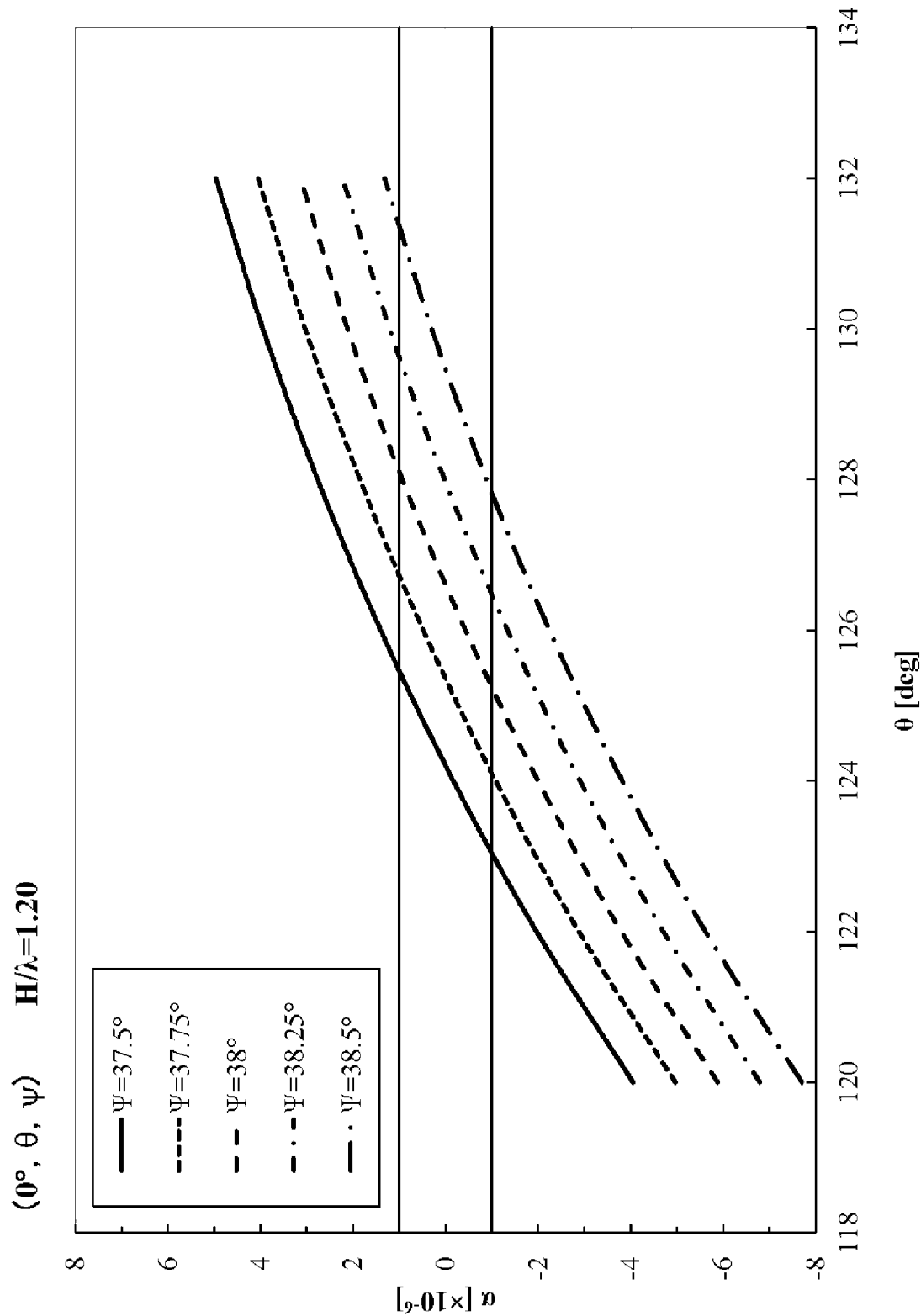

[FIG. 5]
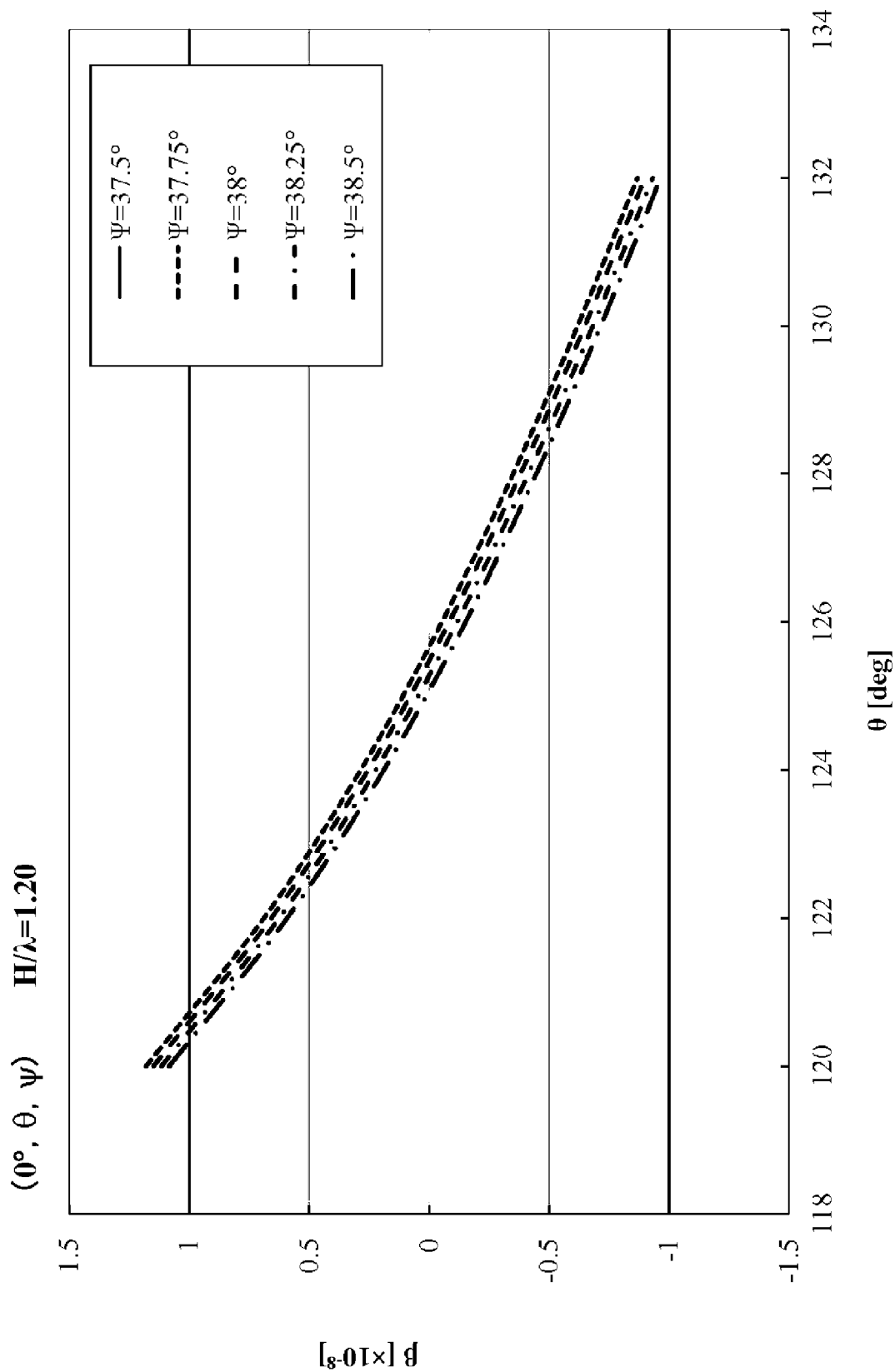

[FIG. 6]
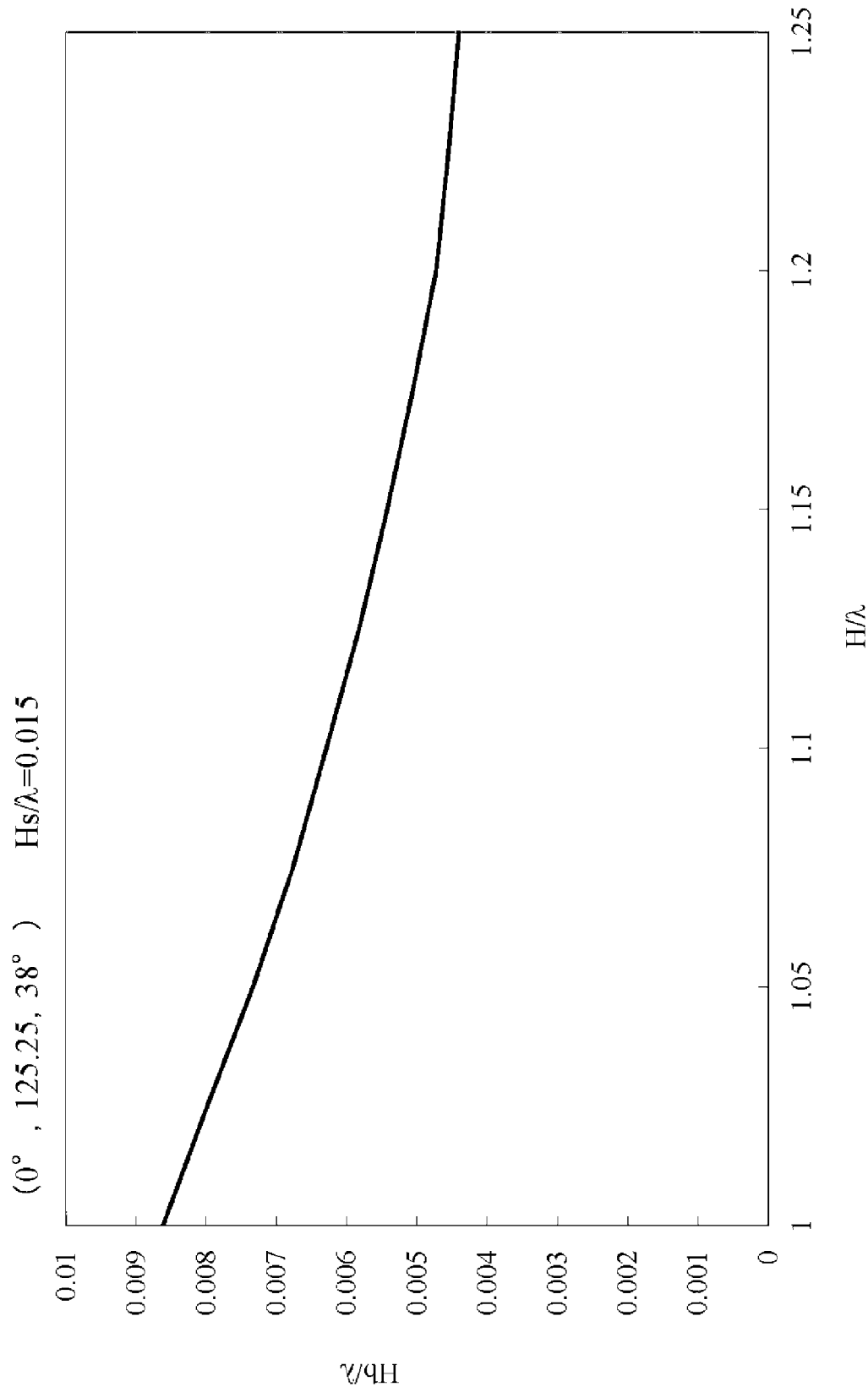

[FIG. 7]
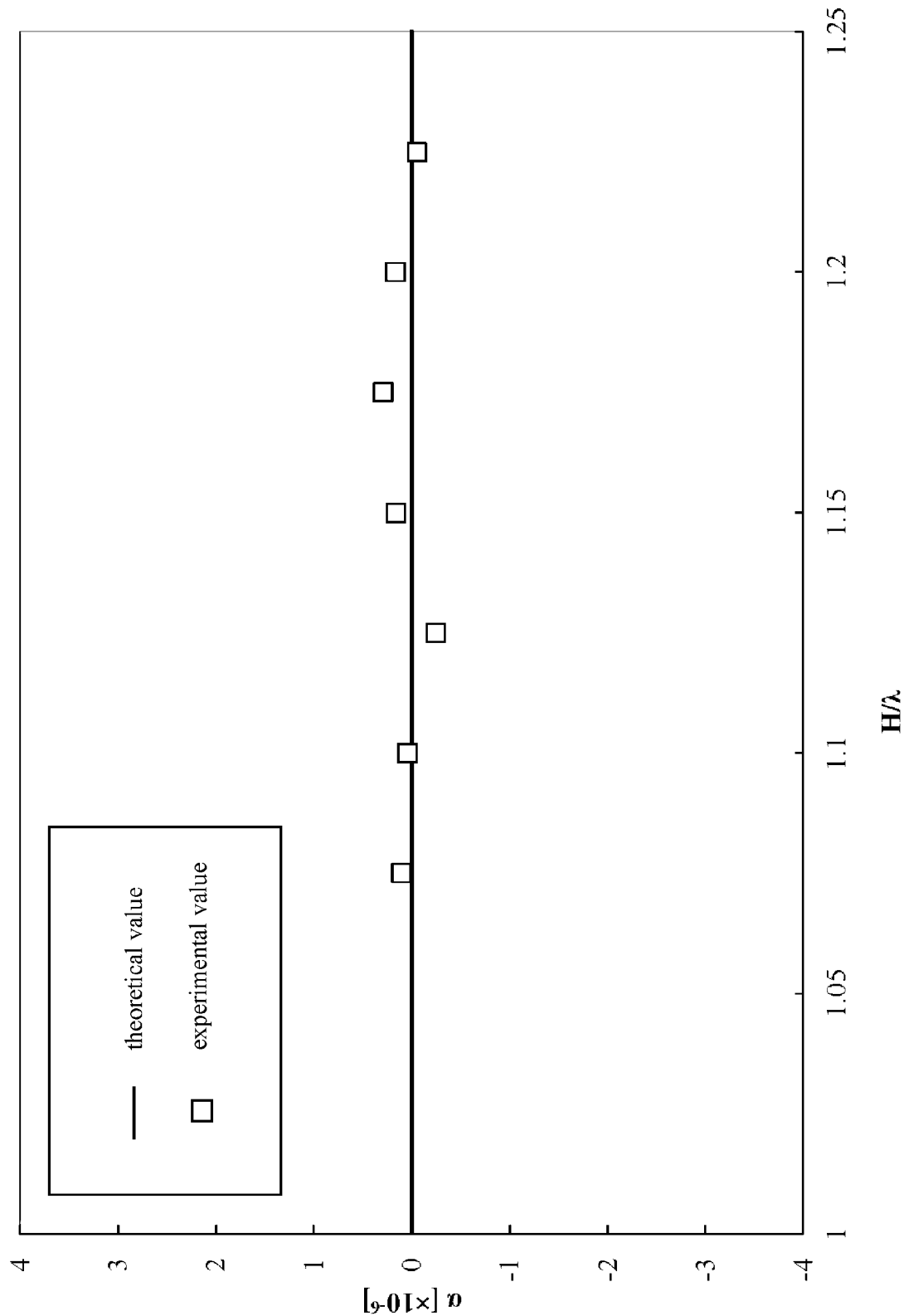

[FIG. 8]
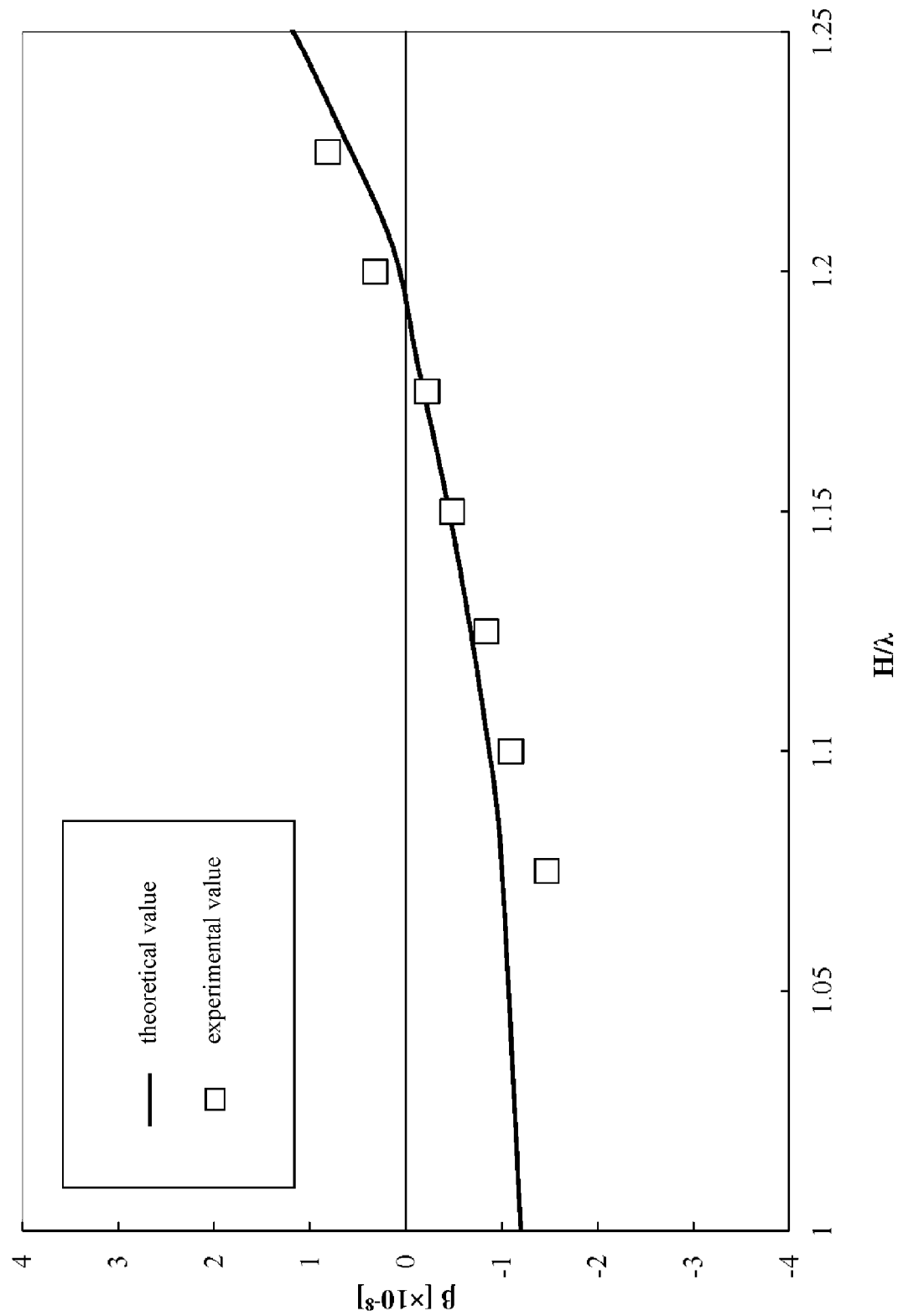

[FIG. 9]
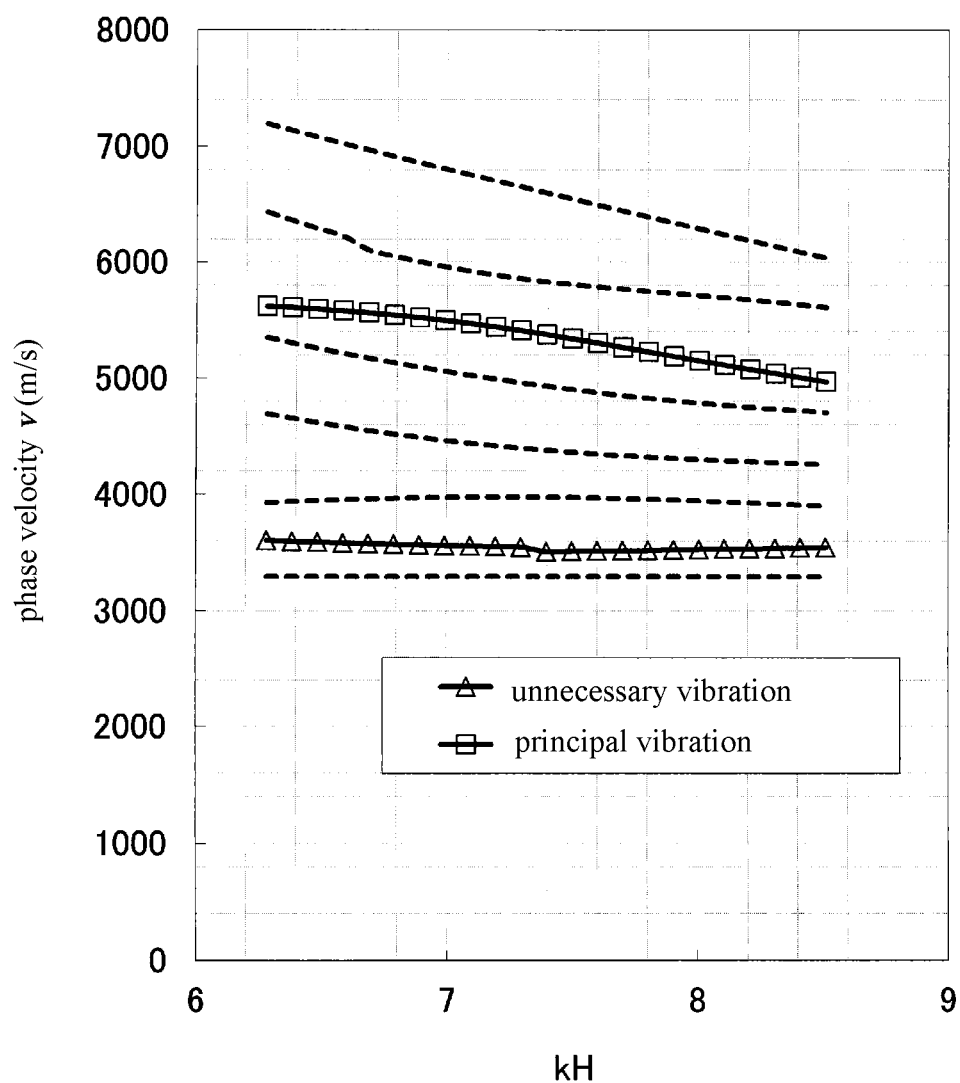

[FIG. 10]
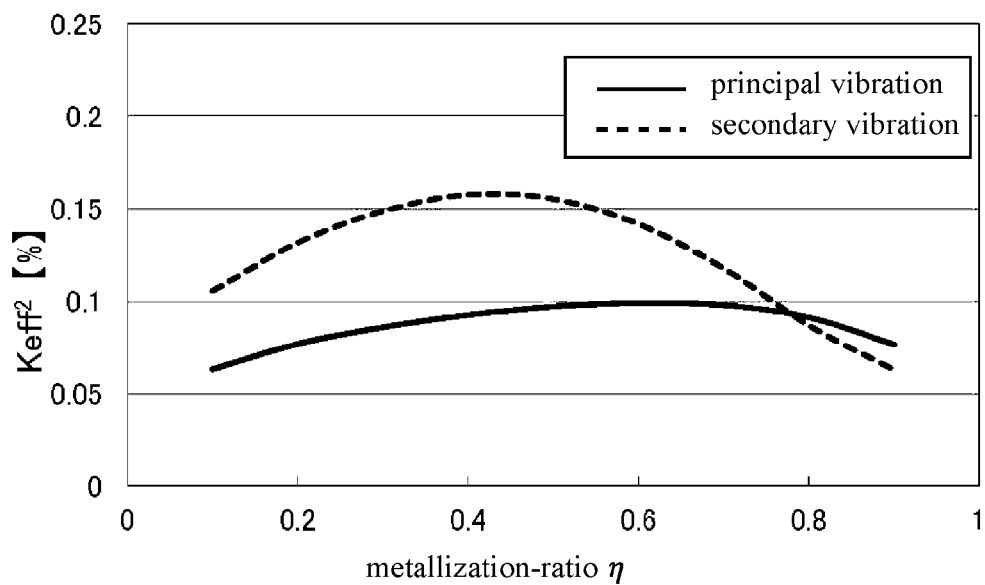
[FIG. 11]
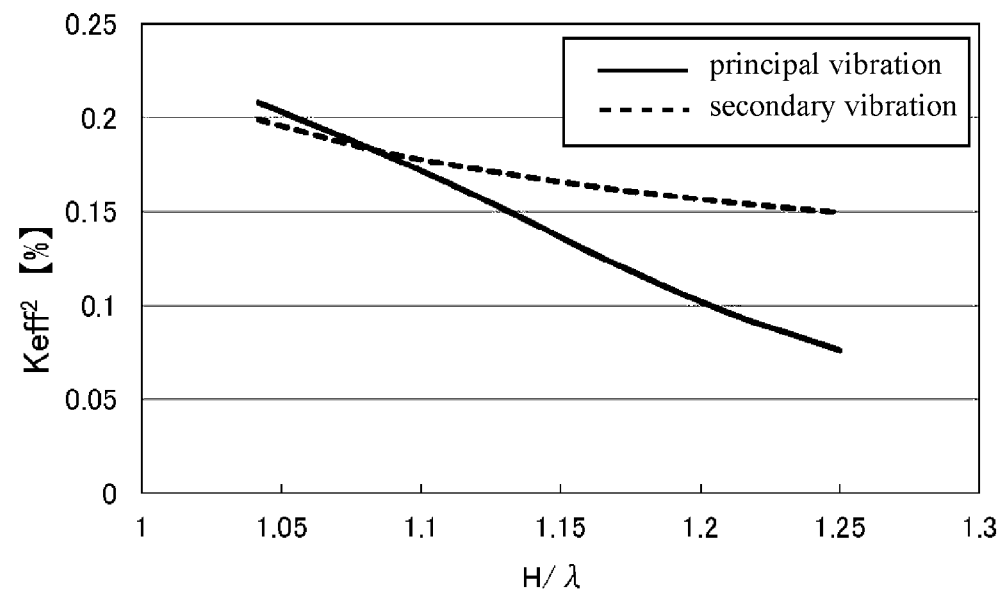

[FIG. 12]
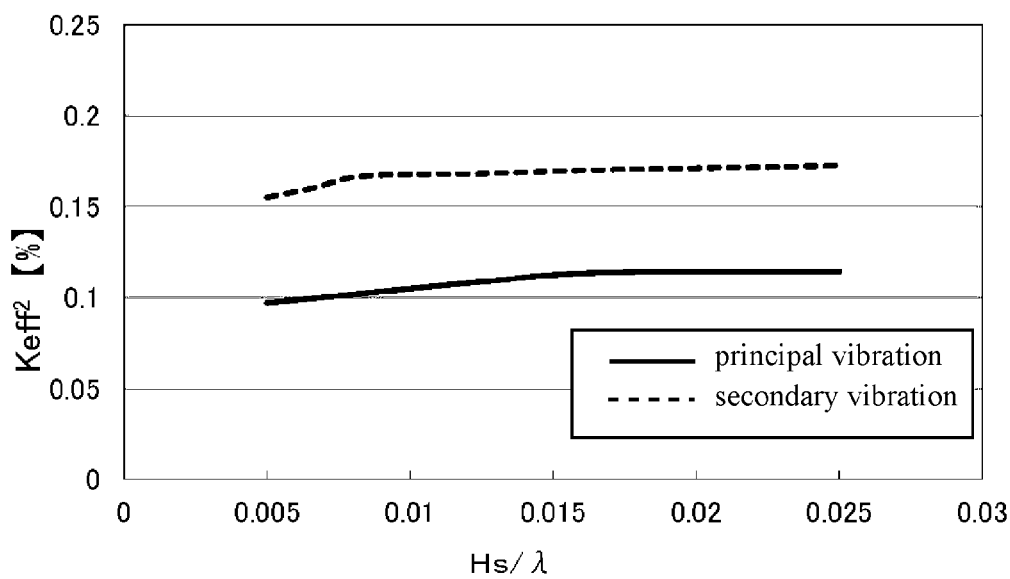
[FIG. 13]
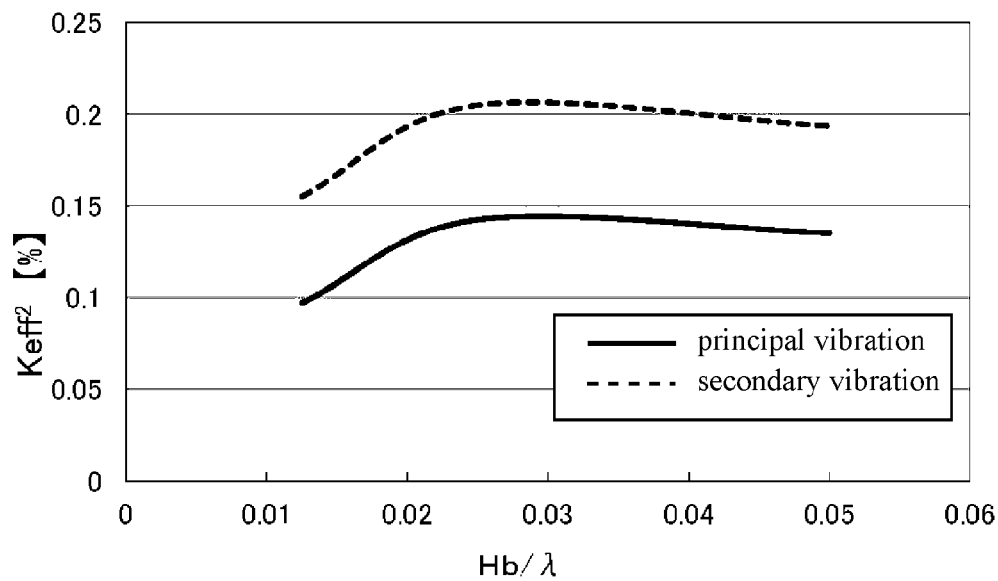

[FIG. 14]
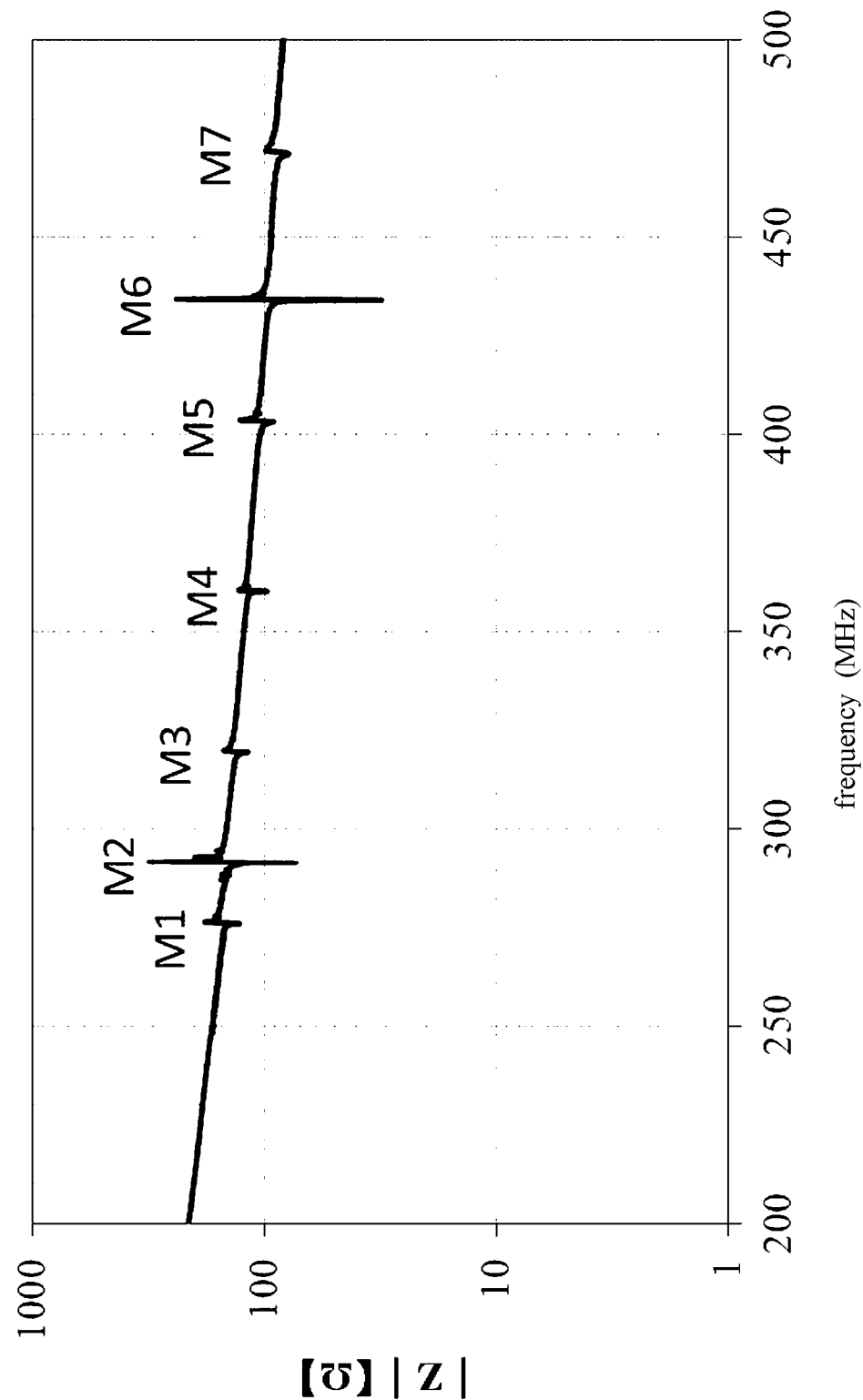

[FIG. 15]
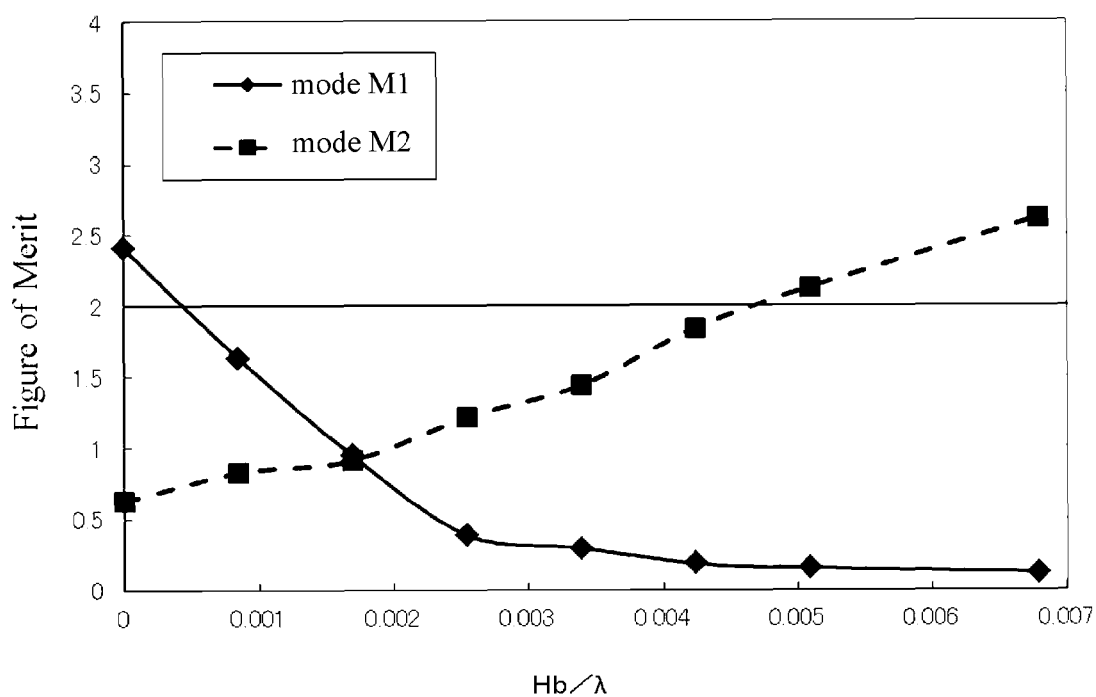

[FIG. 16]
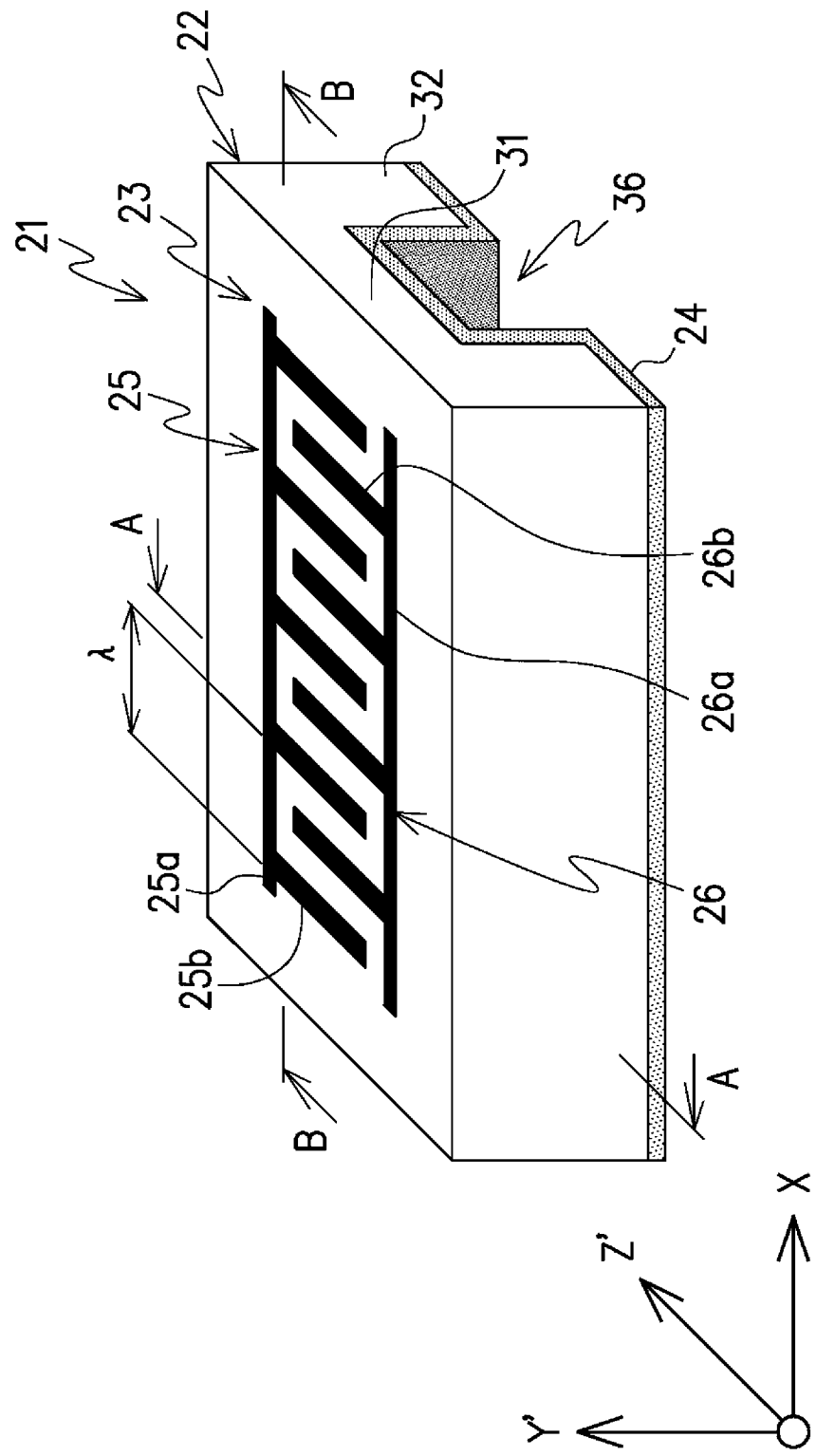

[FIG. 17]
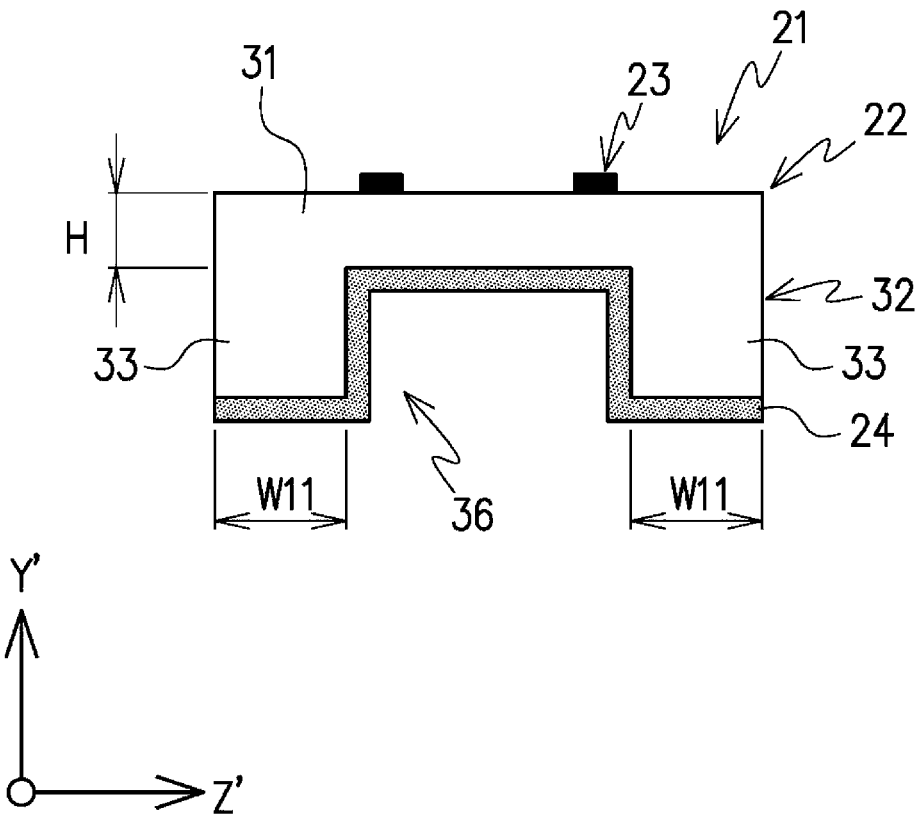
[FIG. 18]
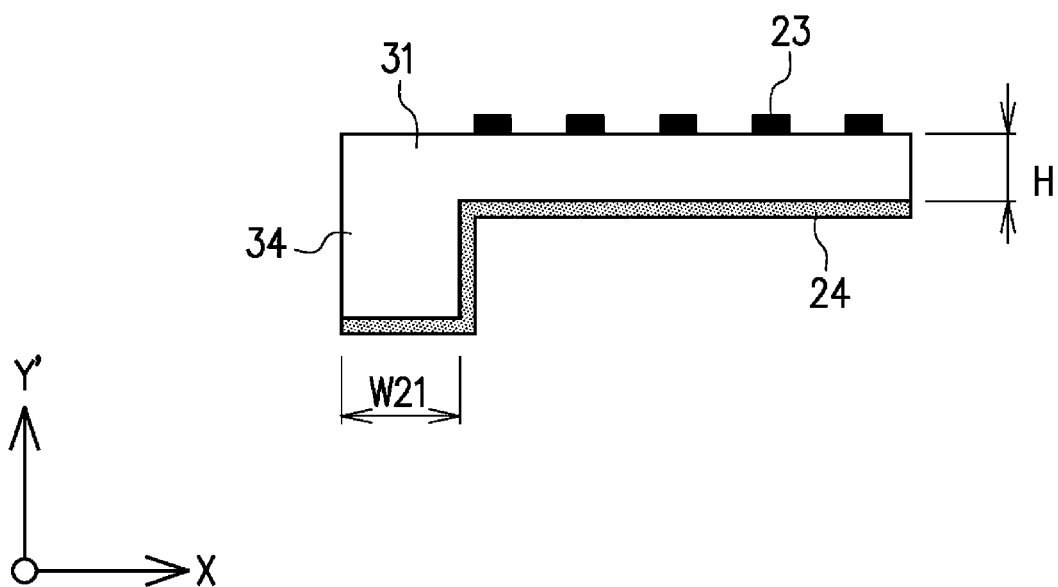

[FIG. 19]
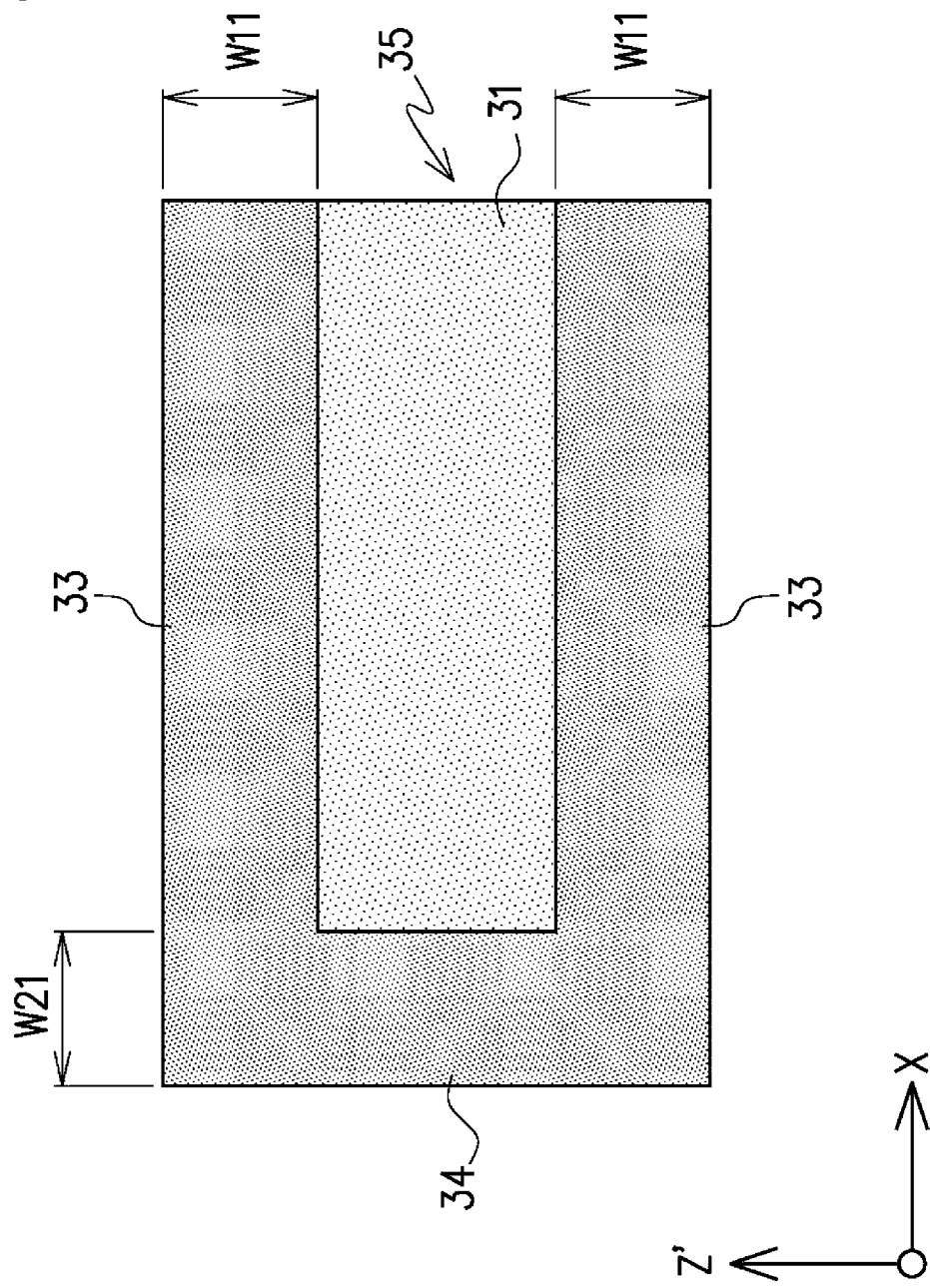

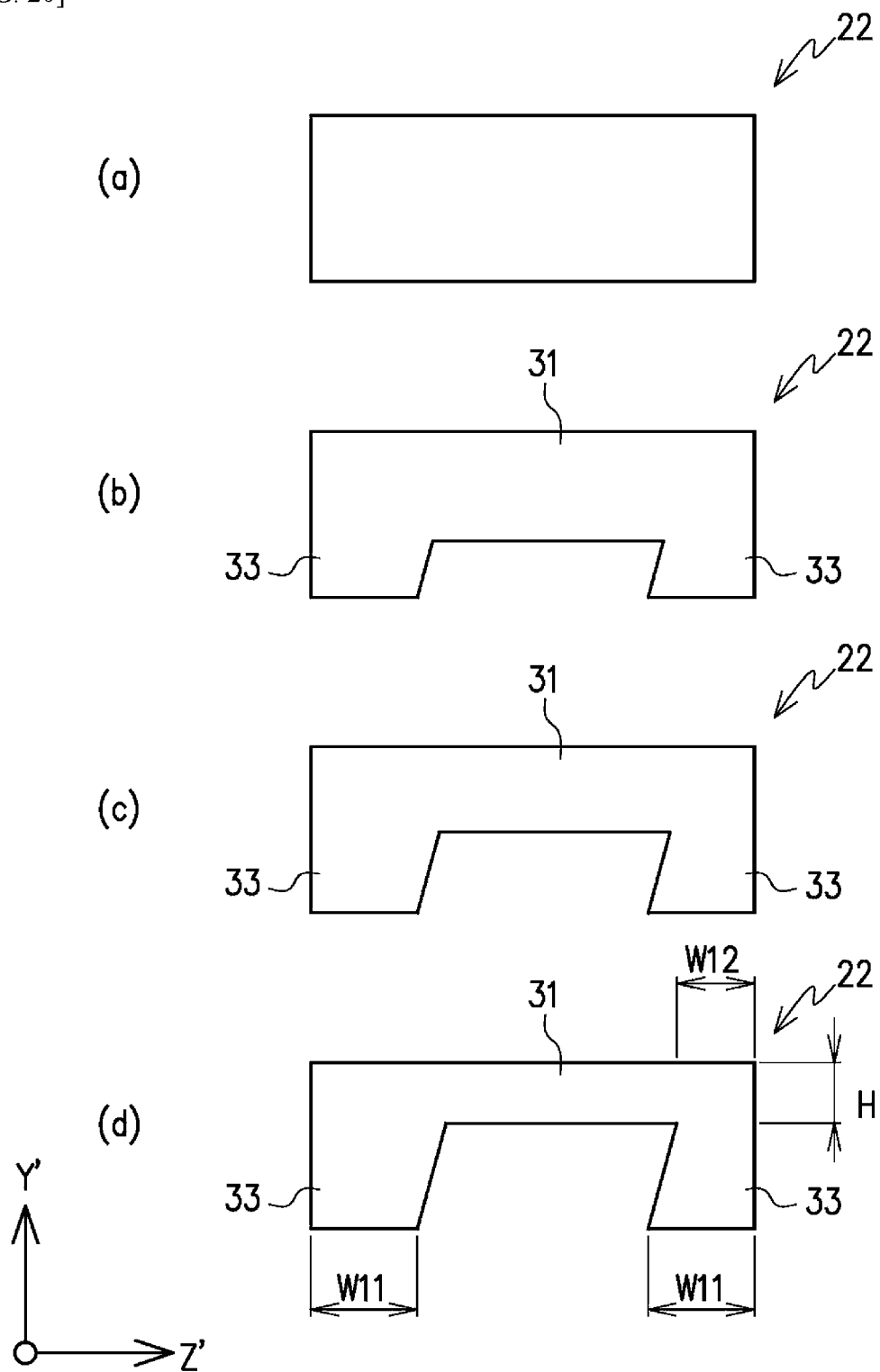
[FIG. 20]

[FIG. 21]
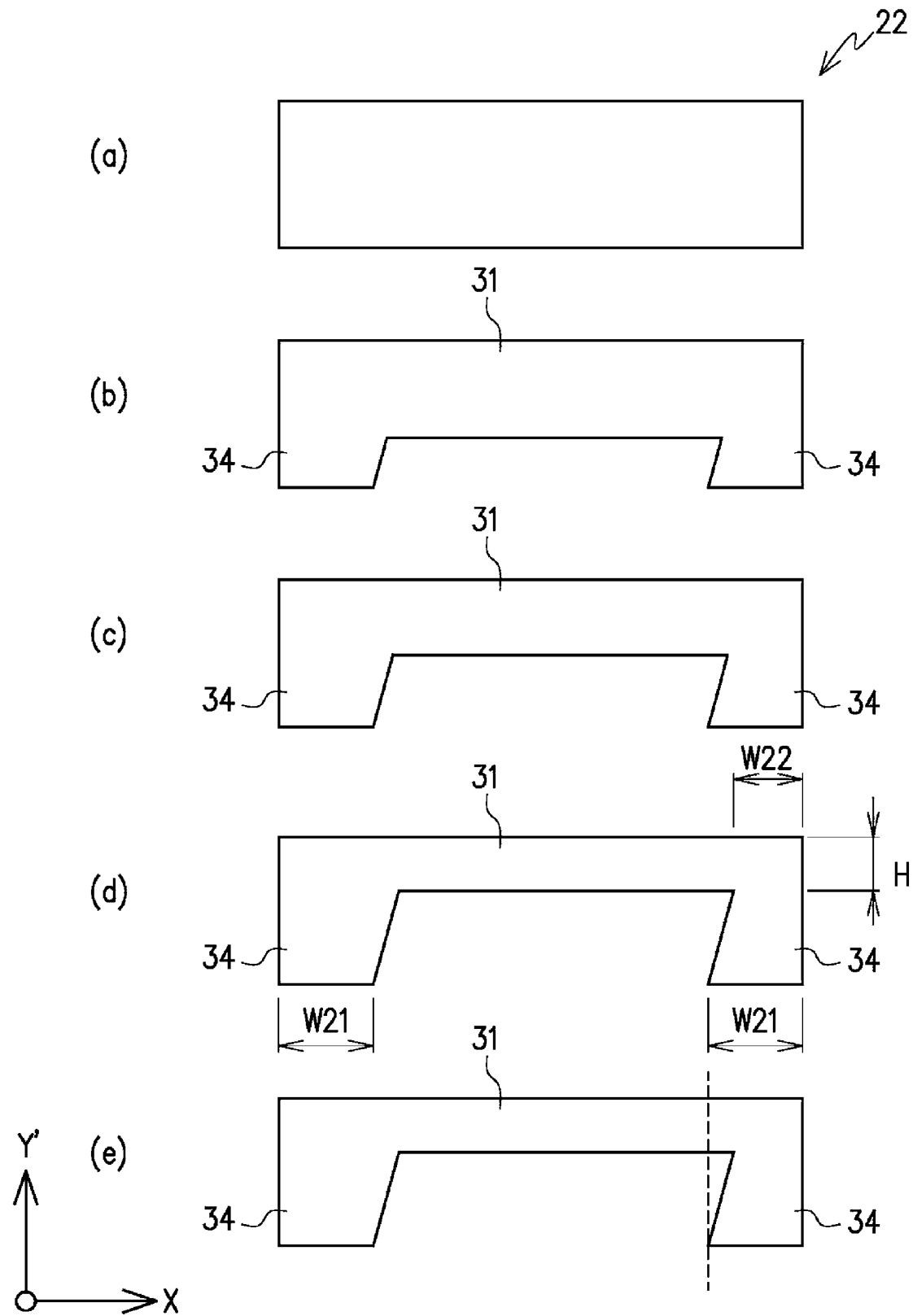

[FIG. 22]
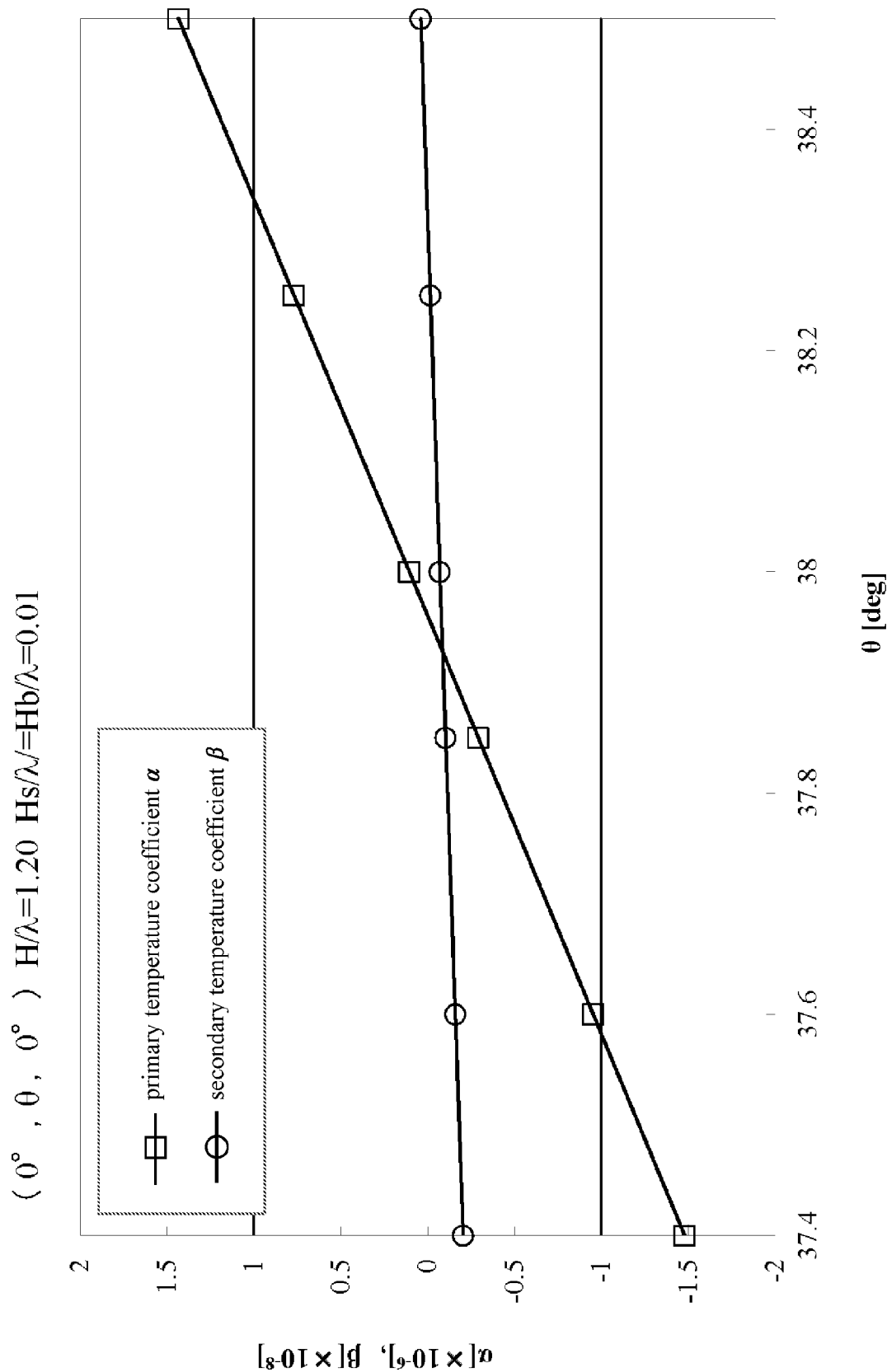

[FIG. 23]
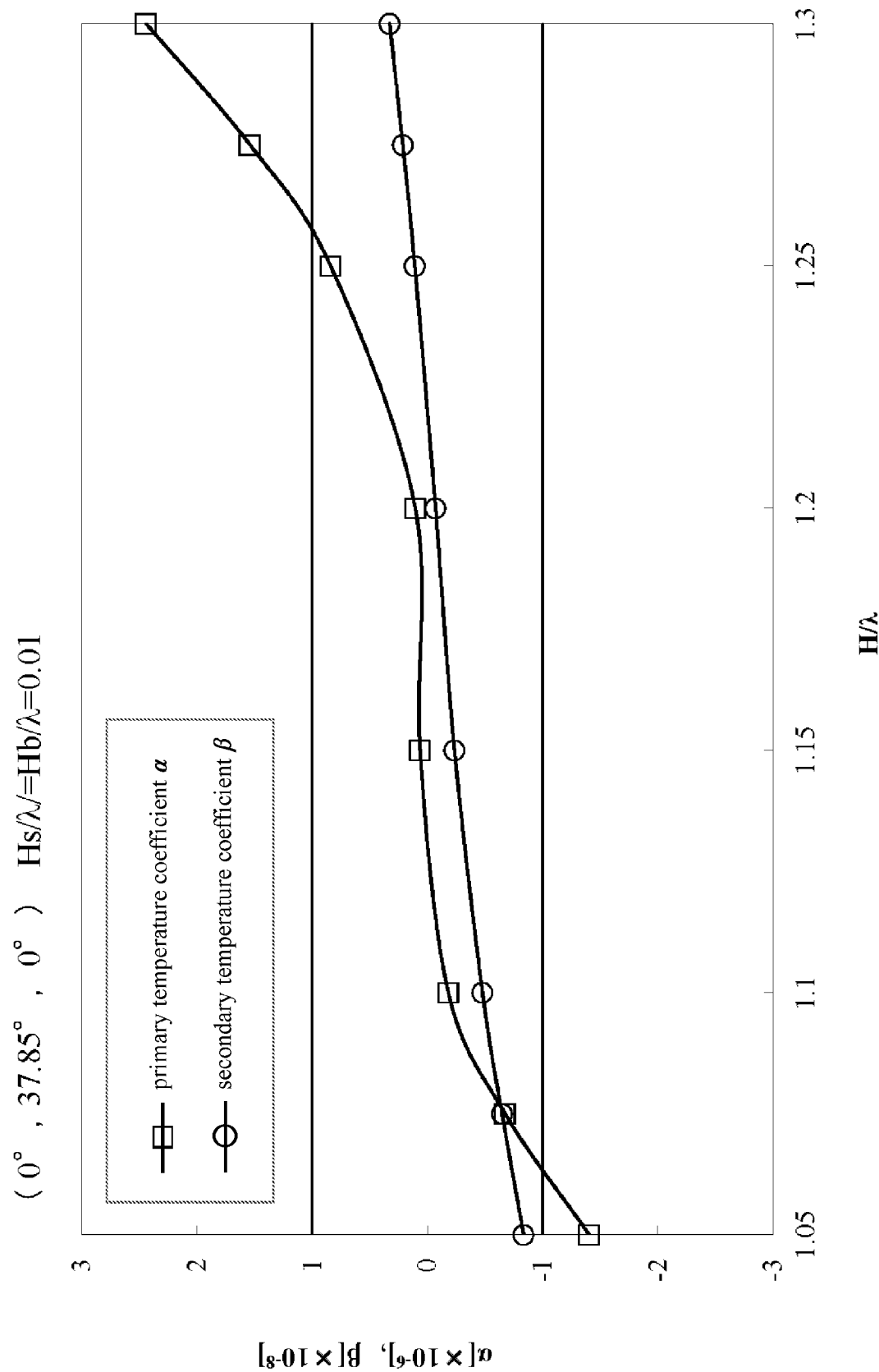

[FIG. 24]
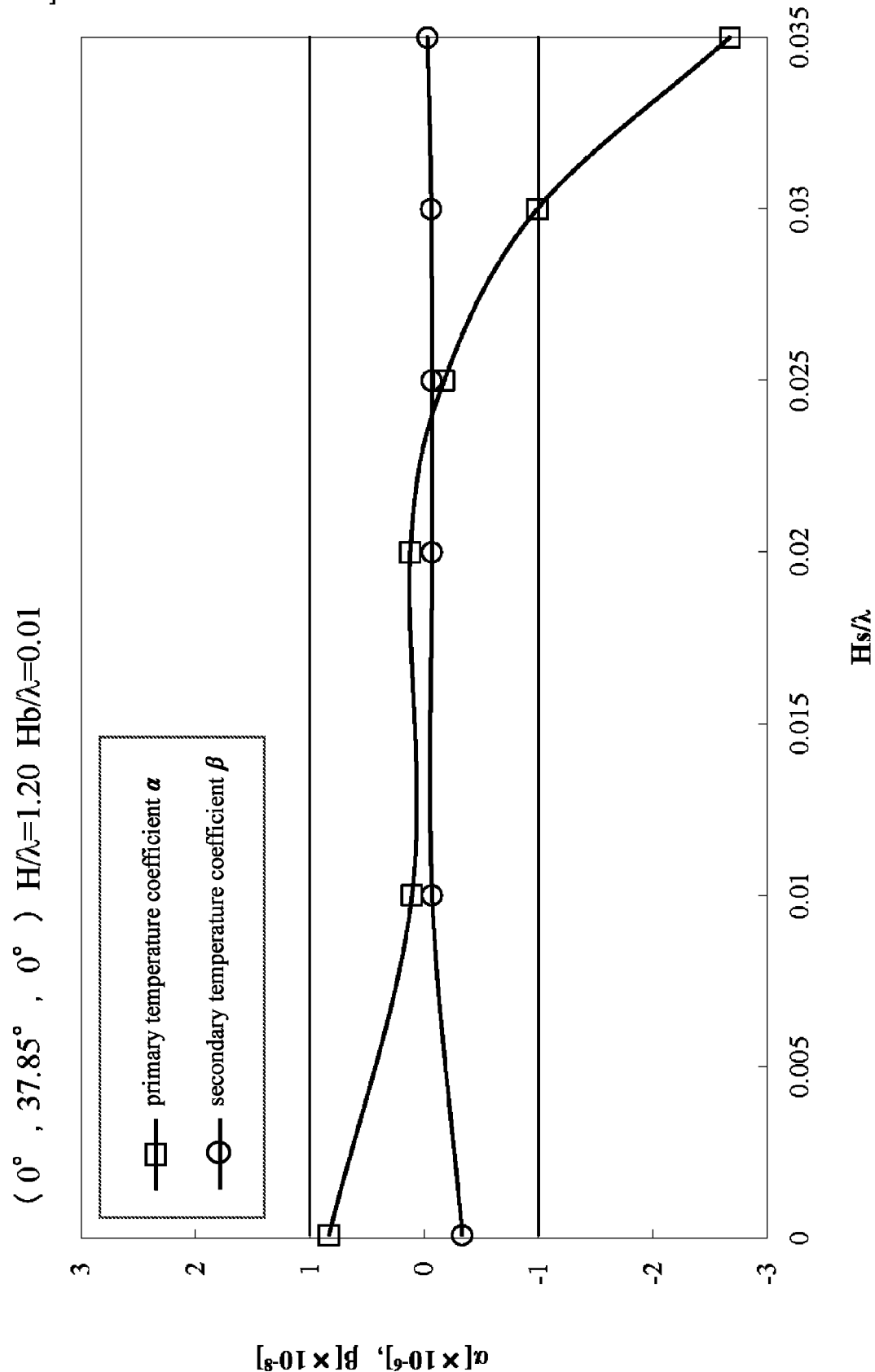

[FIG. 25]
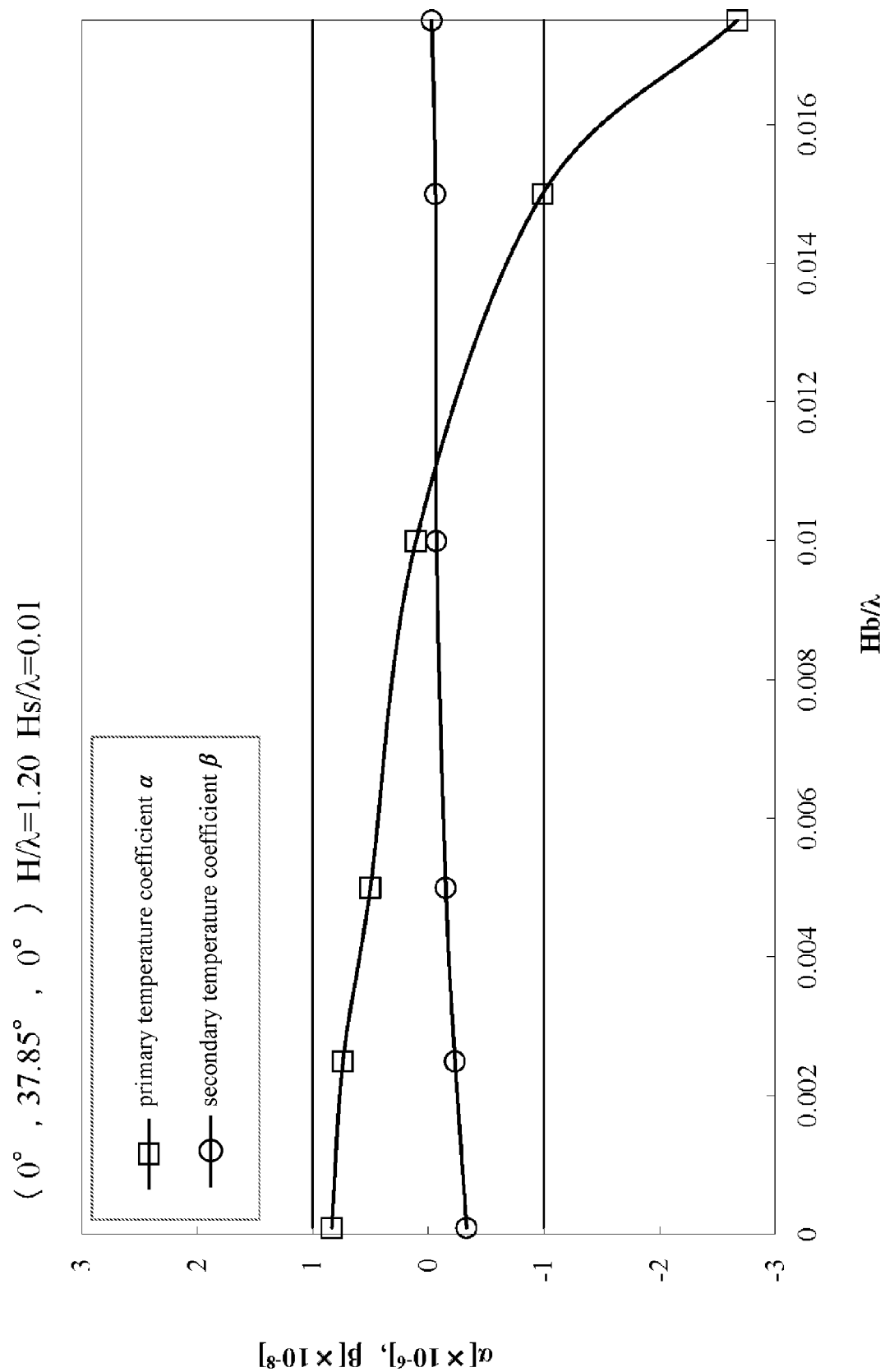

[FIG. 26]
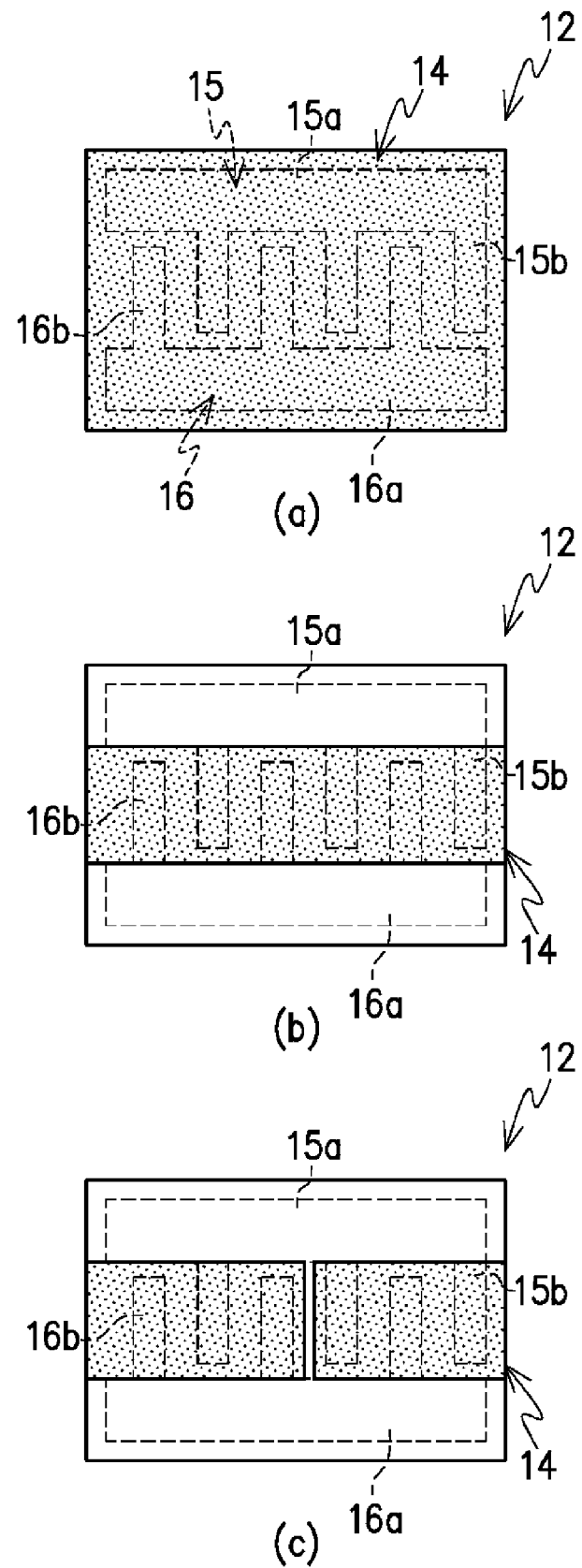

ELASTIC WAVE DEVICE

TECHNICAL FIELD

The present invention relates to an elastic wave device used in computers, telecommunications equipment, and other electronics as a source of a high-frequency of oscillation.

BACKGROUND ART

AT-cut quartz crystal resonators have been commonly used in a variety of electronics as a source of oscillation. To obtain a high-frequency, the frequency of an AT-cut quartz crystal resonator is typically multiplied to a predetermined frequency by a phase-locked loop (PLL). To obtain a low noise signal as well as a high-frequency, a surface acoustic wave device may also be used as a direct source of oscillation.

AT-cut quartz crystal resonators, which can provide stable frequency properties, have been commonly used in many electronics as a source of oscillation. However, an AT-cut quartz crystal resonator needs high-precision processing technique, such as flattening technique and thinning technique, to be used in high-speed computers, telecommunications equipment, and other electronics as a source of a high-frequency of oscillation.

A surface acoustic wave, which includes a longitudinal wave or an SV wave generated on the surface of a piezoelectric substrate, has a frequency proportional to velocity and inversely proportional to a wavelength. The device utilizing this surface acoustic wave typically has an excitation-electrode on the front surface of the piezoelectric substrate cut at a predetermined cutting-angle. The excitation-electrode includes a plurality of electrode-fingers arranged in a comb-like form. Adjusting the film-thickness of the excitation-electrode and the pitch between each of the plurality of electrode-fingers allow the device to have a predetermined frequency of oscillation.

Patent document 1 discloses a piezoelectric device that utilizes a Lamb-wave mode in the surface acoustic wave generated on a rotated Y-cut quartz crystal substrate. The piezoelectric device includes a comb-like excitation-electrode on the front surface of the substrate and a thin-film configured to adjust a frequency on the rear surface of the substrate. The piezoelectric device has a same quadratic function temperature behavior as that of conventional ST-cut quartz crystal resonators Patent documents 2 and 3 disclose resonators that oscillate a lamb-wave. Compared with thickness-shear vibrators, such as AT-cut quartz crystal resonators, the lamb-wave resonators have better frequency properties because they have a cubic function temperature behavior. However, the cutting angle of the quartz crystal substrate of this resonator is specified by a rotation angle of two axes. Such a manufacturing complexity may lead to problems, such as fluctuations in a frequency temperature behavior and manufacturing difficulties.

Patent document 4 discloses a high-frequency resonator that includes a rotated Y-cut quartz crystal substrate specified by Euler angles.

Resonators disclosed in Patent documents 2 to 4 has a structure that includes a comb-like excitation-electrode on the front surface of a piezoelectric substrate. Such a structure does not include any thin-films configured to adjust a frequency on the rear surface of the piezoelectric substrate.

Patent document 5 discloses a relationship between the metallization-ratio of an excitation-electrode and the film-thickness of the excitation-electrode.

A resonator disclosed in Patent document 5 mentioned above has a structure that includes an excitation-electrode on the front surface of a piezoelectric substrate. This structure does not include any thin-films configured to adjust a frequency on the rear surface of the piezoelectric substrate, either.

Patent document 6 describes a method for adjusting a frequency. The frequency is adjusted by trimming the thin-film of an electrode on the opposite side of a surface on which a comb-like electrode is disposed.

Patent document 7 discloses another method for adjusting a frequency. The frequency is adjusted by trimming a thin-film disposed on a surface on which an electrode is disposed.

CITATION LIST

Patent Literature

Patent Document 1 Japanese Unexamined Patent Application Publication No. S57-68925
Patent Document 2 Japanese Unexamined Patent Application Publication No. 2003-258596
Patent Document 3 Japanese Patent No. 4465464
Patent Document 4 Japanese Patent No. 4306668
Patent Document 5 Japanese Unexamined Patent Application Publication No. 2011-171888
Patent Document 6 International Publication No. WO 2010/082571
Patent Document 7 Japanese Unexamined Patent Application Publication No. S59-210708

SUMMARY OF THE INVENTION

Technical Problem

As mentioned above, an AT-cut quartz crystal resonator can provide a very stable frequency of oscillation. However, when the frequency of the AT-cut resonator is multiplied to a predetermined frequency, there may be problems, such as phase noise, jitters from fluctuation, and a time lag in a plurality of signals. On the other hand, an elastic wave device has a low phase noise and good jitter performance because the device can provide a high-frequency directly. However, the frequency stability of oscillation of the device may not be good as that of an AT-cut quartz crystal resonator.

For an elastic wave device using a conventional plate wave described in Patent documents 1 to 4, only θ of the Euler angles of rotation is specified upon cutting the quartz crystal substrate of the device.

Plate waves, which typically are generated by an elastic wave device, are vibration modes that are combinations of a longitudinal wave and an SV wave. Plate waves include multiple vibration modes depending on the ratio of the combination of the longitudinal wave and the SV wave. Unlike a Rayleigh wave, plate waves may include a vibration mode that has both a different velocity and a large electromechanical coupling coefficient $K^2$, other than a necessary principal vibration. Such a vibration mode is called an unnecessary vibration. When both the principal vibration and the unnecessary vibration of the device have the same sign of a reflection coefficient, the unnecessary vibration may have a smaller equivalent series resistance (ESR) compared with the principal vibration. This may cause an abnormal oscillation when the device is oscillated in an oscillation circuit.

Patent documents 6 and 7 describe a method for adjusting a frequency. The frequency is adjusted by trimming. However, there is no mention about specific details and a discussion from the viewpoint of a frequency temperature behavior.

An elastic wave device, especially that with excellent frequency properties, typically includes a vibration-unit configured to propagate a plurality of plate waves, and the vibration-unit is formed as thin as the wavelength of the plurality of plate waves. The frequency of such a device can be adjusted by increasing the film-thickness of an electrode on the vibration-unit and by depositing more thin-films on the opposite side of a surface on which the vibration-unit is disposed, however, such processes may also cause a large variability in a frequency temperature behavior to the device. This leads to limit a range of frequency-adjustment and thus makes an accurate adjustment difficult.

It is, therefore, an object of the present invention to provide an elastic wave device that has a predetermined phase velocity optimum for a high-frequency of oscillation, as well as has a preferred frequency temperature behavior that exhibits a cubic curve by using a rotated Y-cut quartz crystal substrate with novel Euler angles of rotation.

It is an another object of the present invention to provide an elastic wave device that can oscillate a high-frequency directly, has the improved stability of the frequency of oscillation equal to that of an AT-cut quartz crystal resonator, and can prevent an abnormal oscillation caused by the unnecessary vibration when an oscillator is constituted.

It is further object of the present invention to provide an elastic wave device that has both a preferred frequency property and a preferred frequency temperature behavior of a plate wave propagating on the vibration-unit, as well that allows those properties to be easily adjusted, by thinning an excitation-electrode on the vibration-unit and by strengthening a holding-unit holding the vibration-unit.

Solution to Problem

According to one aspect of the present invention, an elastic wave device includes a quartz crystal substrate. The quartz crystal substrate is cut out from a quartz crystal body having three-dimensional crystallite orientation composed of an X-axis, a Y-axis, and a Z-axis with both the Y-axis and the Z-axis rotated around the X-axis, and is cut at rotation angles specified by right-handed Euler-angles ($\phi$, $\theta$, $\Psi$). The elastic wave device also includes at least one excitation-electrode on the front surface of the quartz crystal substrate, and the at least one excitation-electrode is configured to generate a plurality of plate waves. The quartz crystal substrate is cut at the rotation angles in the range of $\phi=0\pm10°$, $\theta=110°$ to $140°$, $\Psi=30°$ to $50°$. The selected vibration mode of the quartz crystal substrate is one of the plurality of plate waves that has a primary temperature coefficient $\alpha\times10^{-6}/°C$. in the range of $-1.0<\alpha<+1.0$ and a secondary temperature coefficient $\beta\times10^{-8}/°C.^2$ in the range of $-1.0<\beta<+1.0$ with Taylor expansion performed at $25°$ C.

According to another aspect of the present invention, an elastic wave device includes a quartz crystal substrate. The quartz crystal substrate is cut out from a quartz crystal body having three-dimensional crystallite orientation composed of an X-axis, a Y-axis, and a Z-axis with both the Y-axis and the Z-axis rotated around the X-axis and is cut at rotation angles specified by right-handed Euler-angles ($\phi$, $\theta$, $\Psi$). The elastic wave device also includes at least one excitation-electrode on the front surface of the quartz crystal substrate, and the at least one excitation-electrode is configured to generate a plurality of plate waves. The quartz crystal substrate is cut at the rotation angles in the range of $\phi=0\pm10°$, $\theta=35°$ to $40°$, $\Psi=0\pm10°$. The selected vibration mode of the quartz crystal substrate is one of the plurality of plate waves that has a primary temperature coefficient $\alpha\times10^{-6}/°C$. in the range of $-1.0<\alpha<+1.0$ and a secondary temperature coefficient $\beta\times10^{-8}/°C$. in the range of $+1.0<\beta<+1.0$ with Taylor expansion performed at $25°$ C.

According to the one aspect of the present invention, the elastic wave device includes the quartz crystal substrate cut at the rotation angles specified by right-handed Euler angles in the range of ($\phi=0°$, $\theta=124°$ to $130°$, $\Psi=37.5°$ to $38.5°$) including a novel combination of $\theta$ and $\Psi$. The plate wave that has a primary temperature coefficient $\alpha\times10^{-6}/°C$. in the range of $-1.0<\alpha<+1.0$ and a secondary temperature coefficient $\beta\times10^{-8}/°C.^2$ in the range of $-1.0<\beta<+1.0$ with Taylor expansion performed at $25°$ C. is selected as the vibration mode of the quartz crystal substrate. Having the plate wave as the vibration mode allows the elastic wave device to have improved stability of a frequency of oscillation equal to that of an AT-cut quartz crystal resonator, as well as to obtain a high-frequency oscillation of a fundamental wave. Thus, it becomes possible to provide the elastic wave device that has preferred frequency properties having a good phase noise and a good jitter performance.

The at least one excitation-electrode is disposed on the front surface of the quartz crystal substrate cut at the Euler angles described above and has a predetermined thickness. A back-electrode configured to adjust a frequency is disposed on the rear surface of the substrate and has a predetermined thickness. By adjusting the film-thickness of the excitation-electrode and/or the film-thickness of the back-electrode, both the frequency properties and the frequency temperature behavior of the selected vibration mode can be adjusted to the optimum.

According to the another aspect of the present invention, the elastic wave device includes the quartz crystal substrate cut at the rotation angles specified by right-handed Euler angles in the range of ($\phi=0°$, $\theta=37.6°$ to $38.3°\Psi=0°$). Even when the plate wave that has a primary temperature coefficient $\alpha\times10^{-6}/°$ C. in the range of $-1.0<\alpha<+1.0$ and a secondary temperature coefficient $\beta\times10^{-8}/°C.^2$ in the range of $-1.0<\beta<+1.0$ with Taylor expansion performed at $25°$ C. is selected as the vibration mode of the quartz crystal substrate, the quartz crystal substrate may have the unnecessary vibrations other than the vibration mode. In such a case, setting the metallization ratio $\eta$ of the at least one excitation-electrode in the range of $0.6<\eta<0.9$ can reduce only the unnecessary vibrations. Satisfying the set conditions of the range of the Euler angles, the primary temperature coefficient, and the secondary temperature coefficient allows the elastic wave device to obtain a precise frequency of oscillation as stable as that of an AT-cut resonator, as well as to obtain a stable high-frequency oscillation of a fundamental wave. Thus, it becomes possible to provide the elastic wave device that has preferred frequency properties having a good phase noise and a good jitter performance.

The at least one excitation-electrode is disposed on the front surface of the quartz crystal substrate cut at the Euler angles described above, and a back-electrode configured to adjust a frequency is disposed on the rear surface of the substrate. The at least one excitation-electrode and the back-electrode have a predetermined film-thickness. By adjusting the film-thickness of the excitation-electrode and/ or the film-thickness of the back-electrode, as well as by setting the metallization ratio η in the range of 0.6<η<0.9, both the frequency properties and the frequency temperature behavior of the selected vibration mode can be adjusted to the optimum.

BRIEF DESCRIPTION OF THE DRAWINGS

FIG. 1 is a schematic perspective view of an elastic wave device according to a first embodiment of the present invention.

FIG. 2 is a diagram illustrating the coordinates of the right-handed Euler-angles of the elastic wave device according to the first embodiment of the present invention.

FIG. 3 is a chart illustrating the dispersion curves of the phase-velocity of vibration modes among a plurality of plate waves generated by the elastic wave device according to the first embodiment of the present invention.

FIG. 4 is a chart illustrating the primary temperature coefficient α of a quartz crystal substrate when both θ and Ψ of rotation angles are specified.

FIG. 5 is a chart illustrating the secondary temperature coefficient fl of a quartz crystal substrate when both θ and Ψ of a rotation angle are specified.

FIG. 6 is a chart illustrating a relationship between the substrate-thickness of a quartz crystal substrate and the film-thickness of a back-electrode when a primary temperature coefficient α is 0.

FIG. 7 is a chart illustrating a relationship between the substrate-thickness of a quartz crystal substrate and a primary temperature coefficient.

FIG. 8 is a chart illustrating a relationship between the substrate-thickness of a quartz crystal substrate and a secondary temperature coefficient.

FIG. 9 is another chart illustrating the dispersion of the phase-velocity of the vibration modes among the plurality of plate waves generated by the elastic wave device according to the first embodiment of the present invention.

FIG. 10 is a chart illustrating a relationship between the metallization ratio and an electromechanical coupling coefficient.

FIG. 11 is a chart illustrating a relationship between the substrate-thickness of a quartz crystal substrate and an electromechanical coupling coefficient.

FIG. 12 is a chart illustrating a relationship between the film-thickness of at least one excitation-electrode and an electromechanical coupling coefficient.

FIG. 13 is a chart illustrating a relationship between the film-thickness of a back-electrode and an electromechanical coupling coefficient.

FIG. 14 is a chart illustrating a relationship between both the frequency of oscillation and the impedance of a plurality of vibration modes.

FIG. 15 is a chart illustrating a relationship between the film-thickness of a back-electrode and figure of merit.

FIG. 16 is a schematic perspective view of an elastic wave device according to a third embodiment of the present invention.

FIG. 17 is a cross-sectional view of the elastic wave device, according to the third embodiment of the present invention, taken along the line A-A of FIG. 16.

FIG. 18 is a cross-sectional view of the elastic wave device, according to the third embodiment of the present invention, taken along the line B-B of FIG. 16.

FIG. 19 is a bottom view of the elastic wave device according to the third embodiment of the present invention.

FIGS. 20A, 20B, 20C, and 20D illustrate the etching process of the elastic wave device, according to the third embodiment of the present invention, viewed from an X-plane.

FIGS. 21A, 21B, 21C, 2D, and 2E illustrate the etching process of the elastic wave device, according to the third embodiment of the present invention, viewed from a Z'-plane.

FIG. 22 is a chart illustrating a relationship between a cutting angle, a primary temperature coefficient, and a secondary temperature coefficient.

FIG. 23 is a chart illustrating a relationship between substrate-thickness, a primary temperature coefficient, and a secondary temperature coefficient.

FIG. 24 is a chart illustrating a relationship between the film-thickness of at least one excitation-electrode, a primary temperature coefficient, and a secondary temperature coefficient.

FIG. 25 is a chart illustrating a relationship between the film-thickness of a back-electrode, a primary temperature coefficient, and a secondary temperature coefficient.

FIGS. 26A, 26B, and 26C are plan view of a plurality of the back-electrode patterns.

DESCRIPTION OF EMBODIMENTS

Embodiments of an elastic wave device according to the present invention will be described hereinafter in detail with reference to the accompanying drawings. As illustrated in FIG. 1, an elastic wave device 11 according to an embodiment of the present invention includes a thin plate-like quartz crystal substrate 12, an excitation-electrode 13 on a front surface 12a of the substrate 12, and a back-electrode 14 on a rear surface 12b of the substrate 12.

The quartz crystal substrate 12 is cut out from a quartz crystal body having three-dimensional crystallite orientation composed of an X-axis, a Y-axis and a Z-axis, and both the Y-axis and the Z-axis are rotated around the X-axis upon cutting. When an X'-axis represents the X-axis after the rotation and a Y'-axis represents the Y-axis after the rotation, a plane that has the Y'-axis as normal direction is defined as a Y'-plane, a plane that has the X-axis as normal direction is defined as an X-plane, and a plane that has the Z'-axis as normal direction is defined as a Z'-plane.

The quartz crystal substrate 12 is cut at rotation angles specified by right-handed Euler angles in the range of (φ=0°, θ=125°, Ψ=38°) and has a predetermined substrate-thickness. The excitation-electrode 13 includes a comb-like inter-digital-transducer (IDT)-electrode 15 and an IDT-electrode 16 that are paired. The IDT-electrode 15 includes a base-electrode 15a extending in a longitudinal direction of the substrate 12 and a plurality of electrode-fingers 15b extending from a lateral side of the base-electrode 15a. Similarly, the IDT-electrode 16 includes a base-electrode 16a extending in a longitudinal direction of the substrate 12 and a plurality of electrode-fingers 16b extending from a lateral side the base-electrode 16a. The plurality of electrode-fingers 15b, which are extending from the lateral side of the base-electrode 15a, and the plurality of electrode-fingers 16b, which are extending from the lateral side of the base-electrode 16a, are interdigitated without making contact each other and form the excitation-electrode 13. A pitch (or an interval) between the electrode-finger 15b and 16b is determined based on the wavelength λ of a plurality of plate waves excited, and when the wavelength of the plurality of plate waves is λ, the pitch is about λ/2. In the excitation-electrode 13, applying voltages having different polarities from each other to the IDT-electrode 15 and the IDT-electrode 16 generates an alternating electric field between the adjacent electrode-fingers, and then the plurality of plate waves are excited in the substrate 12.

The quartz crystal substrate 12 is cut at a rotated Y-cut and has a substrate-thickness H as thin as the wavelength λ of the plurality of plate waves excited. The substrate-thickness H is adjusted based on the relationship between the film-thickness of both the excitation-electrode 13 and the back-electrode 14 to obtain a preferred frequency temperature behavior.

As illustrated in FIG. 1, the excitation-electrode 13 is formed by depositing a metal film that is made from mainly gold (Au) or aluminum (Al) on the center of the front surface 12a of the quartz crystal substrate 12 and has a predetermined film-thickness. A plurality of reflectors (not illustrated) may be disposed on both sides sandwiching the excitation-electrode 13. By disposing the plurality of reflectors, the plate wave excited in the excitation-electrode 13 can be confined between the plurality of reflectors on the both sides, and a large resonance can be obtained.

The back-electrode 14 is deposited on the rear surface 12b of the quartz crystal substrate 12, and the rear surface 12b is opposite to a surface on which the excitation-electrode 13 is deposited. This back-electrode 14 is formed by depositing a film that is made from a metal material, such as Au, or is made from a dielectric material on the rear surface 12b of the substrate 12 and has a predetermined film-thickness. Other than Au, Al, Ta, or Cu can be used as the metal material, and $SiO_2$, ZnO, or $Ta_2O_5$ can be used as the dielectric material. Furthermore, adjusting the film-thickness of the back-electrode 14 made of such a material allows an accurate adjustment of a frequency of oscillation and, depending on a relationship with the substrate-thickness H and the excitation-electrode 13, enables the elastic wave device 11 to have a cubic function temperature behavior.

FIG. 2 is a diagram illustrating the coordinates of right-handed Euler-angles (φ, θ, Ψ). φ represents a rotation angle around the Z-axis, θ represents a rotation angle around the X'-axis (which is the X-axis rotated by ω around the Z-axis), and Ψ represents a rotation angle around a Z"-axis (which is the Z-axis rotated by θ around the X'-axis). The quartz crystal substrate with the Euler-angles of (φ=0°, θ=0°, Ψ=0°) has a principal plane perpendicular to optical axis, which is a Z-axis of a quartz crystal, and thus is defined as a rotated Z-cut quartz crystal substrate. Hereinafter, these coordinates are used to explain the analyzations of the elastic wave device 11. FIG. 3 illustrates the dispersion curves of the plurality of plate waves propagating in the quartz crystal substrate 12 with the Euler-angles of (φ=0°, θ=125°, =38°) when Hs/λ, which is the normalized film-thickness of the excitation-electrode, is 0 and Hb/λ, which is the normalized film-thickness of the back-electrode, is 0.

The dispersion curves in FIG. 3 represent the vibration modes called a plate wave (or a lamb wave), which is the combination of a longitudinal wave and an SV wave. Such vibration modes, unlike a surface wave, exhibit frequency dispersion relative to substrate-thickness and include a considerable number of vibration modes with various frequency temperature behaviors and diverse phase velocities ranging from slow to fast. In this embodiment, one of the plurality of plate waves that has the phase velocity in the range of 3500 m/s to 4500 m/s and a frequency temperature behavior that satisfies conditions described below is selected as the vibration mode of the elastic wave device.

FIG. 4 illustrates the calculation results of the primary temperature coefficient α of a plurality of the vibration modes propagating the quartz crystal substrate 12 with right-handed Euler-angles of (φ=0°, θ, Ψ) when θ is a variable. FIG. 5 illustrates the calculation results of the secondary temperature coefficient β of a plurality of the vibration modes propagating the quartz crystal substrate 12 with right-handed Euler-angles of (φ=0°, θ, Ψ) when θ is a variable. In both FIGS. 4 and 5, a normalized substrate-thickness H/λ=1.18, and the film-thickness of both an excitation-electrode and a back-electrode are disregarded.

Both FIGS. 4 and 5 indicate that the primary temperature coefficient $α×10^{-6}/°$ C. is in the range of $-1.0<α<+1.0$ and the secondary temperature coefficient $β×10^{-8}/°$ $C.^2$ is in the range of $-1.0<β<+1.0$ when Ψ=38° is adjacent to φ=125°.

A dispersion curve expressed by solid line in FIG. 3 is the vibration mode selected in accordance with such a condition above, and the phase velocity of this mode is within the range of 3500 m/s to 4500 m/s in the condition. However, both the primary temperature coefficient α and the secondary temperature coefficient β of the mode may not be 0 in practice because FIGS. 4 and 5 are based on theoretical values and are subject to errors. Taking such errors into account, an optimum condition is decided to be where a center value is proximate to 0 when the center value represents the intersection point of both the characteristic curve of the primary temperature coefficient α and the curve of the secondary temperature coefficient β.

The following will describe an optimum combination of H/λ, Hs/λ, and Hb/λ when H/λ represents a normalized substrate-thickness, Hs/λ represents the normalized film-thickness of an excitation-electrode, and Hb/λ represents the normalized film-thickness of a back-electrode. FIG. 6 illustrates the calculated result of combinations of the H/λ and the Hs/λ when a primary temperature coefficient α=0, the Euler-angles of the quartz crystal substrate are (φ=0°, θ=125.25°, Ψ=38°), both the excitation-electrode 13 and the back-electrode 14 are made from Au, and the Hs/λ=0.015. This result indicates that the primary temperature coefficient α varies depending on the film-thickness of the back-electrode 14. Thus, adjusting θ and Ψ of the rotation angles, the substrate-thickness, and other conditions appropriately enable optimum vibration properties to be provided.

TAB. 1 below is a comparison between the theoretical value and the experimental value of the phase velocity of the plurality of vibration modes when the elastic wave device 11 is fabricated with the Euler-angles of (φ=0°, θ=125.25°, Ψ=37.5°). The plurality of vibration modes selected for this comparison have relatively a large electromechanical coupling coefficient $K^2$ and exhibit an admittance-waveform visible enough for measurement. MODE 3 is a vibration mode actually used for the embodiment of the present invention. A difference between the theoretical value and the experimental value varies by a vibration mode, but is within 100 m/s.

TABLE 1

| | Theoretical value (m/s) | Experimental value (m/s) |
|---|---|---|
| MODE 1 | 3052 | 3049 |
| MODE 2 | 3603 | 3621 |
| MODE 3 | 3891 | 3927 |
| MODE 4 | 4376 | 4413 |
| MODE 5 | 4960 | 5008 |
| MODE 6 | 6304 | 6361 |
| MODE 7 | 6873 | 6919 |

TABLE 1-continued

| | Theoretical value (m/s) | Experimental value (m/s) |
|---|---|---|
| MODE 8 | 7140 | 7189 |
| MODE 9 | 7156 | 7251 |
| MODE 10 | 7784 | 7852 |

FIG. 7 illustrates differences between the theoretical values and the experimental values of a primary temperature coefficient α, and FIG. 8 illustrates the differences between the theoretical values and the experimental values of a secondary temperature coefficient β. Ψ is adjusted for each substrate-thickness in such a manner that the primary temperature coefficient $\alpha \times 10^{-6}/°C$. is within the range of $-1.0 < \alpha < +1.0$. A set condition is that Hs/λ=0.0015 and Hb/λ=0.0045 to 0.0070, and is adjusted in such a manner that the primary temperature coefficient $\alpha \times 10^{-6}/°C$. is within the range of $-1.0 < \alpha < +1.0$, using Au for a excitation-electrode and a back-electrode.

FIGS. 7 and 8 indicate that the differences are small and thus the theoretical values are likely to be valid. When H/λ is adjacent to 1.18, the primary temperature coefficient $\alpha \times 10^{-6}/°C$. the range of $-1.0 < \alpha < +1.0$ and the secondary temperature coefficient $\beta \times 10^{-8}/°C.^2$ is in the range of $-1.0 < \beta < +1.0$. This indicates a preferred frequency temperature behavior can be obtained. Additionally, when the material of both the excitation-electrode 13 and the back-electrode 14 and/or the film-thickness of both the excitation-electrode 13 and the back-electrode 14 are changed, it is necessary that the substrate-thickness and/or θ and Ψ of the rotation angles also be changed accordingly. Same effects can be obtained when Al isused in place of Au for both the excitation-electrode 13 and the back-electrode 14.

According to the results above, designing an elastic wave device with
θ in the range of θ=124° to 130°,
Ψ in the range of Ψ=37.5° to 38.5°,
and H/λ in the range of H/λ=1.10 to 1.25,
allows a preferred plate wave to be generated.
The preferred plate wave has
a phase velocity in the range of 3500 to 4500 m/s,
a primary temperature coefficient $\alpha \times 10^{-6}/°C$. in the range of $-1.0 < \alpha < +1.0$, and
a secondary temperature coefficient $\beta \times 10^{-8}/°C.^2$ in the range of $-1.0 < \beta < +1.0$.
However, when the elastic wave device 11 is manufactured actually, the cutting angle of the quartz crystal substrate 12 may not be in conformance with the conditions above due to production variation. Taking this variation into account, the quartz crystal substrate 12 having
rotation angles in the range of φ=0±10°, θ=110° to 140°, Ψ=30° to 50° and
H/λ in the range of H/λ=0.8 to 1.4
is sufficient to obtain the effects of the invention.

The following will describe a second embodiment of the present invention based on the quartz crystal substrate 12 shown in FIG. 1. The quartz crystal substrate 12 according to this embodiment is cut at rotation angles specified by right-handed Euler angles in the range of (φ=0°, θ=37.6° to 38.3°, Ψ=0°) and has a predetermined substrate-thickness.

FIG. 9 illustrates dispersion curves of a plurality of plate waves propagating in the quartz crystal substrate 12 with the Euler-angles of (φ=0°, θ=37.6° to 38.3°, Ψ=0°) when Hs/λ=0 and Hb/λ=0.

The dispersion curves in FIG. 9 are a plurality of vibration modes called a plate wave or a lamb wave, which is the combination of a longitudinal wave and an SV wave. These vibration modes, unlike a surface wave, exhibit frequency dispersion relative to a substrate-thickness. While plate waves includes multiple vibration modes as indicated by those dispersion curves, one of the plate waves that has a phase velocity in the range of 4500 m/s to 6000 m/s is selected as the vibration mode (or the principal vibration) of this embodiment. The other plate waves below the plate wave of the principal vibration are unnecessary vibrations (or secondary vibrations), which may disturb the principal vibration.

Having multiple vibration modes, such an elastic wave device can have a secondary vibration with a slower sound velocity than the principal vibration, same sign of a reflection coefficient as the principal vibration, and a large effective electromechanical coupling coefficient Keff$^2$ compared with the principal vibration. However, reducing the Keff$^2$ such a secondary vibration leads to increase the ESR of the secondary vibration, and thus prevents an abnormal oscillation caused by the secondary vibration. In the embodiment according to the present invention, the metallization-ratio η of the excitation-electrode 13 configured to generate the plurality of plate waves is set to an optimum value to reduce the electromechanical coupling coefficient K$^2$ mentioned before. The metallization-ratio η is defined by Lt and Li. The Lt represents the width of the electrode-finger 15b of the excitation-electrode 13, the Li represents the width from the inner side of the electrode-finger 15b to the outer side of an electrode-finger 16b opposed to the electrode finger 15b, as illustrated in FIG. 1. The equation of the metallization-ratio η is expressed below. In addition, the wavelength λ is defined by the width between the adjacent electrode-fingers 15b on the same base-electrode 15a.

η=Lt/Li

An elastic wave device that generates a plurality of plate waves, such as the present invention, typically uses a quartz crystal substrate having a substrate-thickness that is as thin as the wavelength λ. Thus, the electromechanical coupling coefficient K$^2$ of the device is greatly influenced by the film-thickness of both the excitation-electrode 13 and the back-electrode 14. An effective electromechanical coupling coefficient Keff$^2$ is thus used to evaluate the piezoelectricity of the elastic wave device according to the embodiment of the present invention, nevertheless K$^2$ is commonly used as a standard for piezoelectric performances. Keff$^2$ is expressed by the equation below with a resonant frequency fr and an antiresonant frequency fa.

$$keff^2 = \left(\frac{\pi}{2} \cdot \frac{fr}{fa}\right) / \tan\left(\frac{\pi}{2} \cdot \frac{fr}{fa}\right) \quad \text{[Equation 1]}$$

FIGS. 10 to 13 illustrate the Keff$^2$ of both the principal vibration and the secondary vibration when the quartz crystal substrate 12 is cut at the right-handed Euler angles in the range of (φ=0°, θ=37.6° to 38.3°, Ψ=0°) and Au is used for both the excitation-electrode 13 and the back-electrode 14. The metallization ratio η, the H/λ, the Hs/λ, the Hs/λ, and the Hb/λ are set as variable by turns in the charts.

FIG. 10 illustrates the Keff$^2$ of both the principal vibration and the secondary vibration when H/λ=1.20, Hs/λ=0.005, Hb/λ=0.013, and the metallization η is a variable. Although the η is commonly set to about 0.5, changing the η from 0.5 in a predetermined range allows the oscillation caused by the secondary vibration to be reduced. Thus, in this embodiment, the η is changed in the predetermined range to evaluate the range that allows the Keff² of the secondary vibration to be reduced effectively while the principal vibration properties are still preserved.

In FIG. 10, the Keff² of both the principal vibration and the secondary vibration are analyzed while the metallization ratio η of the excitation-electrode 13 is changed. The elastic wave device for this analyzation includes the quartz crystal substrate 12 specified by right-handed Euler-angles (φ,θ,Ψ), and the rotation angles of the substrate 12 are set in the range of (φ=0°,θ=37.6° to 38.3°, Ψ=0°). The selected vibration mode of the quartz crystal substrate is one of the plurality of plate waves that has a primary temperature coefficient α×10⁻⁶/°C. in the range of −0.5<α<+0.5 and a secondary temperature coefficient β×10⁻⁸/°C.² in the range of −1.0 <β<+1.0 with Taylor expansion performed at 25° C. The phase velocity of the vibration mode in such a condition is in the range of 4500 m/s to 6000 m/s.

The result above indicates that setting the metallization η in the range of 0.6<η<0.9 effectively reduces the Keff² of the secondary vibration while preserving the Keff² of the principal vibration. This increases the ESR of the secondary vibration and thus prevents the secondary vibration from impeding the selected principal vibration mode having the phase velocity described above.

The following will describe other analyzations when another condition is set to be a variable. FIG. 11 illustrates the Keff² of both the principal vibration and the secondary vibration when the metallization ratio η=0.5 and the H/λ is a variable. As shown in FIG. 11, as the H/λ becomes larger, the Keff² of the principal vibration significantly drops. Thus, it is preferable that the H/λ is equal or less than 1.25 in this condition.

FIG. 12 illustrates the Keff² of both the principal vibration and the secondary vibration when the metallization ratio η=0.5, the H/λ=1.20, the Hb/λ=0.013, and the Hs/λ is a variable. FIG. 13 illustrates the Keff² of both the principal vibration and the secondary vibration when the metallization η=0.5, the H/λ=1.20, the Hs/λ=0.005 and the Hb/λ is a variable. Both FIGS. 12 and 13 indicate that changing the Hs/λ and the Hb/λ changes the Keff² itself but does not change a correlation between the Keff² of the principle vibration and the Keff² of the secondary vibration. Additionally, Au is used for both the excitation-electrode 13 and the back-electrode 14 in this embodiment. However, using Al instead of Au does not change the correlation between the principal vibration and the secondary vibration either.

As shown in FIGS. 10 to 13, as the H/λ becomes larger, the Keff² of both the principle vibration and the secondary vibration significantly drops, and the reduction effect of the secondary vibration is presented. However, to obtain a predetermined phase velocity as well as a stable high-frequency property for the embodiment of the present invention, it is preferable that the H/λ is equal or less than 1.25 and the metallization ratio η is in the range of 0.6<η<0.9. Additionally, changing the Hs/λ and the Hb/λ does not provide a direct effect to reduce the secondary vibration. However, the Hs/λ and the Hb/λ are still useful parameters for achieving the high frequency of oscillation or for adjusting a frequency temperature behavior accurately.

The following will describe the relationship between the film-thickness of the back-electrode 14 and the unnecessary vibration with reference to FIGS. 14 and 15. FIG. 14 illustrates an impedance waveform Z when the wavelength λ=11.78 μm and the substrate-thickness H=14.4 μm. In the observable waveform, the lowest frequency and the second lowest frequency (M1 and M2) are the vibration modes that may cause an abnormal oscillation, and the frequency of the principal vibration, M6, is 433 MHz. This result demonstrates that the phase property of both the vibration modes (M1 and M2), which may cause an abnormal oscillation, is affected by the film-thickness of the back-electrode 14, Hb/λ, according to a figure of merit M in FIG. 15.

A figure of merit M is calculated by dividing the quality factor (or Q-factor) of a quartz crystal resonator by a capacity ratio γ, and indicates the strength of the mechanical vibration of the resonator from the viewpoint of an electrical terminal. When the figure of merit M is more than 2, the resonator typically becomes inductive and thus can oscillate in a Colpitts oscillator. However, when the figure of merit M is less than 2, reactance of the resonator is positive, and thus the resonator does not become inductive. This makes it difficult for the resonator to oscillate in the Colpitts oscillator. The result in FIG. 15 indicates using Au for the back-electrode 14 makes the figure of merit M less than 2, provided that Hb/λ is in the range of 0.001<Hb/λ<0.005. This thus allows the unnecessary vibration caused by the mode M1 and M2 to be reduced, and prevents the abnormal oscillations in the Colpitts oscillator.

In the manufacturing process of both the elastic wave device 11 and an elastic wave device 21 according to the embodiments of the present invention, setting a condition that the figure of merit M of the principal vibration is equal or more than 2 and that the figure of merit M of the unnecessary vibration is less than 2, and then determining the substrate-thickness of the quartz crystal substrate and the film-thickness of the back-electrode under the condition, allows the unnecessary vibration to be reduced effectively and enables more stable vibration properties to be obtained.

The following will describe a third embodiment of the present invention with reference to FIGS. 16 to 25. As illustrated in FIG. 16, an elastic wave device 21 according to this embodiment includes a quartz crystal substrate 22 including a recessed-portion 36, which opens to one side, on the rear surface of the substrate 22. The elastic wave device 21 also includes an excitation-electrode 23 on the front surface of the substrate 22. A back-electrode 24 may be disposed on the rear surface of the substrate 22 along the surface of the recessed-portion 36. This enables a frequency or other properties to be adjusted accurately.

The quartz crystal substrate 22 is cut from a quartz crystal body with right-handed Euler angles (φ, θ, Ψ) illustrated in FIG. 2. At this step, the quartz crystal body does not include the recessed-portion 36. Then, the recessed-portion 36 is formed on the substrate 22 by etching. In this embodiment, the quartz crystal substrate 22 is cut at the rotation angles in the range of (φ=0°, θ=37.6° to 38.3°, Ψ=0°) and has a predetermined substrate-thickness.

As illustrated in FIGS. 17 to 19, the quartz crystal substrate 22 includes a vibration-unit 31 and a holding-unit 32, which are both formed by etching. The vibration-unit 31 is flat and parallel to the Y'-plane, and the substrate-thickness H of the vibration-unit 31 is as thin as the wavelength λ. The holding-unit 32 holds an outer periphery of the vibration-unit 31. The vibration-unit 31 and the holding-unit 32 are integrated with each other and form the substrate 22. The substrate-thickness H of the vibration-unit 31 is approximately the same as the wavelength λ of the plurality of plate waves, and the wavelength λ is specified by an interval between adjacent electrode-fingers 25b and 26b. The holding-unit 32 includes at least one sidewall 33 and at least one sidewall 34, and the at least one sidewall 33 and the at least one sidewall 34 are extending downward from the vibration-unit 31 to a predetermined thickness. To obtain a preferred frequency temperature behavior, the substrate-thickness H is adjusted based on the relationship between the film-thickness of the excitation-electrode 23 and the film-thickness of the back-electrode 24.

The at least one sidewall 33, as illustrated in FIGS. 17 to 19, faces the Z'-plane and has a width W11. The width W11 is larger than the substrate-thickness H of the vibration-unit 31. The at least one sidewall 34, as illustrated in FIGS. 18 and 19, faces the X-plane and has a width W21. The width W21 is larger than the width W11 of the at least one sidewall 33. An opening 35 is deposited on the opposite side of a sidewall 34, which has the width W21.

The quartz crystal substrate 22 is formed in the etching process of thinning the vibration-unit 31. Thus, each of the sidewalls of the substrate has a width specified to withstand the etching. When the rotated Y-cut quartz crystal substrate 22 is processed by wet-etching to form the recessed-portion 36 shown in FIG. 16, large inclinations may be formed on the Z'-planes facing each other and the X-planes facing each other, as illustrated in the FIGS. 20A to 21E. The inclinations are caused by the difference of an etching rate, and the difference of the etching rate is attributed to anisotropy of a quartz crystal. For a typical quartz crystal resonator, only the inclination of the Z'-plane may be a problem because the inclination of the Z'-plane is commonly larger than that of the X-plane. However, for an elastic wave device that propagates plate waves, such as the elastic wave device 21 according to the embodiment of the present invention, even the small inclination of the X-plane may greatly affect the vibration-properties as well as the inclination of the Z'-plane.

To eliminate such an inclination on a part on which the excitation-electrode 23 or the plurality of reflectors (not illustrated) are disposed, the opening 35 is disposed on the X-plane instead of the sidewall 34, as illustrated in FIGS. 19 and 21. This allows the excitation-electrode 23 or the plurality of reflectors to be disposed on the part, which is formed thin and flat by etching, of the vibration-unit 31, and thus enables the Q-factor to be enlarged while propagation properties of the plate wave are still preserved.

The following will describe the etching process of a quartz crystal substrate having a structure described above with reference to FIGS. 20A to 21E. First, the quartz crystal substrate is cut out from a crystal body that has three-dimensional crystallite orientation composed of an X-axis, a Y-axis and a Z-axis. The quartz crystal substrate is cut at right-handed Euler angles in the range of ($\phi=0°$, $\theta=37.6°$ to $38.3°$, $\Psi=0°$). Then, an etching mask is disposed on the rear surface of the substrate excluding a part on which the recessed-portion 36 is to be formed. After that, the quartz crystal substrate is eroded by wet-etching solution from the direction of Y'-plane and then etched deeply in a Y'-direction until the vibration-unit 31 has a predetermined substrate-thickness H.

FIGS. 20A to 20D show the etching process viewed from the X-plane, and FIGS. 21A to 21E are the same process viewed from the Z'-plane. Both of the processes proceed at approximately the same time. When the quartz crystal piece 22 is eroded by wet-etching, the Z'-planes are eroded at the same time as the Y'-plane is eroded from the viewpoint of the X-plain, as illustrated in FIGS. 20B to 20D. Similarly, the X-planes are eroded at the same time as the Y'-plane is eroded from the viewpoint of Z'-plane, as illustrated in FIGS. 21B to 21D. The erosion also form a min-width 12, which is the minimum width of the at least one sidewall viewed from the X-plane as illustrated in FIG. 20D. It is preferable that the min-width 12 is larger than the substrate-thickness H of the vibration-unit 31 for strength. Similarly, the erosion also forms a min-width 22, which is the minimum width of the at least one sidewall viewed from the Z'-plane as illustrated in FIG. 21E. If the min-width 22 is smaller than the substrate-thickness H of the vibration-unit 31, the sidewall having the min-width may be cut and be an opening, as illustrated in FIG. 21E, for strength. The other sidewall would be thick enough to be able to maintain the strength.

The following will demonstrate the frequency temperature behavior of the elastic wave device 21 including the quartz crystal substrate 22 described above. An elastic wave device that generates a plurality of plate waves typically has a frequency that varies, depending on the normalized substrate-thickness $H/\lambda$, in the manufacturing process. More specifically, when multiple elastic wave devices are produced from one quartz crystal wafer, unevenness of the substrate-thickness of the wafer may cause a variation in a frequency as well as a large fluctuation in a frequency temperature behavior to each elastic wave device that is made from the wafer.

The elastic wave device 21 according to the embodiment of the present invention includes the back-electrode 24 on the opposite side of the excitation-electrode 23. Adjusting the film-thickness of both the excitation-electrode 23 and the back-electrode 24 allows the fluctuation in the frequency temperature behavior, which is defined by primary temperature coefficient $\alpha$ and secondary temperature coefficient $\beta$, to be reduced and enables the elastic wave device 21 to have the optimum vibration mode with a predetermined phase velocity.

In this embodiment, the quartz crystal substrate 22 with the Euler angles of ($\phi=0°$, $\theta=37.85°$, $\Psi=0°$) is used, the excitation-electrode 23 is disposed on the front surface of the substrate 22, and the back-electrode 24 is disposed on the rear surface of the substrate 22. The excitation-electrode 23 and the back-electrode 24 are both formed by a thin-film made from Au. FIG. 22 is a chart illustrating the relationship between a cutting angle $\theta$, a primary temperature coefficient $\alpha$, and a secondary temperature coefficient $\beta$. FIG. 23 is a chart illustrating the relationship between $H/\lambda$, a primary temperature coefficient $\alpha$, and a secondary temperature coefficient $\beta$. FIG. 24 is a chart illustrating a relationship between $Hs/\lambda$, a primary temperature coefficient $\alpha$, and a secondary temperature coefficient $\beta$. FIG. 25 is a chart illustrating the relationship between $Hb/\lambda$, and a primary temperature coefficient $\alpha$, and a secondary temperature coefficient $\beta$.

According to FIGS. 22 to 25, designing an elastic wave device with
$\theta$ in the range of $\theta=37.6°$ to $38.3°$,
$H/\lambda$ in the range of $1.07<H/\lambda<1.25$,
$Hs/\lambda$ in the range of $0.00<Hs/\lambda<0.03$, and
$Hb/\lambda$ in the range of $0.00<Hb<0.05$,
allows a preferred plate wave to be generated. The preferred plate wave has a phase velocity in the range of 4500 to 6000 m/s,
a primary temperature coefficient $\alpha \times 10^{-6}/°C$. in the range of $-1.0<\alpha<+1.0$, and
a secondary temperature coefficient $\beta \times 10^{-8}/°C.^2$ in the range of $-1.0<\beta<+1.0$.

Additionally, this design also allows a variation in the primary temperature coefficient $\alpha$ to be confined effectively if the substrate-thickness is varied or when the frequency is already adjusted.

However, when the elastic wave device 21 is manufactured in practice, the cutting angle of the quartz crystal substrate 22 may not be in conformance with the conditions above due to production variation. Taking this variation into account, the quartz crystal substrate 22 having rotation angles in the range of $\phi=0\pm10°$, $\theta=35°$ to $40°$, $\Psi=0\pm10°$
and H/λ in the range of H/λ=1.00 to 1.35
is sufficient to obtain the effects of the invention.

As shown in FIG. 26A, in the elastic wave device 11 according the first embodiment of the present invention, the back-electrode 14 is disposed over the entire rear surface of the quartz crystal substrate 12 so that that the pair of IDT-electrodes 15 and 16 on the front surface seems to be covered entirely. However, as shown in FIGS. 26B and 26C, the back-electrode 14 is disposed on a partial rear surface corresponding with an area that includes the electrode-fingers 15b and 16b but excludes the base-electrodes 15a and 16b of the pair of IDT-electrodes 15 and 16, to obtain the preferred properties of the first embodiment and to suppress an increase in shunt capacitance generated in the substrate 12.

When the back-electrode is disposed over the entire rear surface of the quartz crystal substrate 12, the wiring pattern of the pair of IDT-electrodes 15 and 16 may cause electrostatic capacity to generate between the back-electrode 14 and the IDT-electrodes. This increases shunt capacitance and thus causes a bad phase property. To reduce such unnecessary electrostatic capacity in the substrate 12 and prevent the bad phase property, the back-electrode 14 is disposed only on the partial rear surface, which corresponds with the area that includes the electrodes-fingers 15b and 16b configured to generate the plurality of plate waves. Additionally, the structures shown in FIGS. 26B and 26C may be applied to the elastic wave device 21 according to the second embodiment of the present invention, and the preferred effects described above can be obtained too.

While the back-electrode illustrated in FIG. 26B includes one electrode, the other back-electrode illustrated in FIG. 26C includes a plurality of divided electrodes. When the back-electrode is divided into the plurality of electrodes as illustrated in FIG. 26C, the width of a gap between the plurality of divided electrodes is preferably approximately one eighth of the wavelength of the plurality of plate waves.

REFERENCE SIGNS LIST 11 elastic wave device
12 quartz crystal substrate
13 excitation-electrode
14 back-electrode
15 IDT-electrode
16 IDT-electrode
15a base-electrode
16a base-electrode
15b electrode-finger
16b electrode-finger
21 elastic wave device
22 quartz crystal substrate
23 excitation-electrode
24 back-electrode
25 IDT-electrode
26 IDT-electrode
25a base-electrode
26a base-electrode
25b electrode-finger
26b electrode-finger
31 vibration-unit
32 holding-unit
33 sidewall
34 sidewall
35 opening
36 recessed-portion

The invention claimed is:

1. An elastic wave device, comprising:
a quartz crystal substrate cut out from a quartz crystal body having three-dimensional crystallite orientation comprised of an X-axis, a Y-axis, and a Z-axis, with both the Y-axis and the Z-axis rotated around the X-axis, the quartz crystal substrate being cut at rotation angles specified by right-handed Euler-angles ($\phi,\theta,\Psi$), and having a substrate-thickness H/λ in a range of 0.8<H/λ<1.4; and
at least one excitation-electrode on a front surface of the quartz crystal substrate, the at least one excitation-electrode being configured to generate a plurality of plate waves,
wherein the quartz crystal substrate is cut at rotation angles in a range of $\phi=0\pm10°$, $\theta=110°$ to $140°$, $\Psi=30°$ to $50°$ and
wherein the vibration mode of the quartz crystal substrate is selected to be one of the plurality of plate waves having a primary temperature coefficient of frequency $\alpha\times10^{-6}/°C$. in a range of $-1.0<\alpha<+1.0$ and a secondary temperature coefficient of frequency $\beta\times10^{-8}/°C^2$ in a range of $-1.0<\beta<+1.0$ with Taylor expansion performed at 25° C. as well as having a phase velocity of 3500 m/s to 4500 m/s.

2. The elastic wave device according to claim 1, further including a back-electrode configured to adjust a frequency on a rear surface of the quartz crystal substrate.

3. The elastic wave device according to claim 1, wherein the at least one excitation-electrode comprises a plurality of interdigital-transducer-electrodes comprising a plurality of electrode-fingers, and further including a back-electrode configured to adjust a frequency on a partial rear surface of the quartz crystal substrate, the partial rear surface corresponding with an area comprising the plurality of electrode-fingers.

4. An elastic wave device, comprising:
a quartz crystal substrate cut out from a quartz crystal body having three-dimensional crystallite orientation comprised of an X-axis, a Y-axis, and a Z-axis, with both the Y-axis and the Z-axis rotated around the X-axis, the quartz crystal substrate being cut at rotation angles specified by right-handed Euler-angles ($\phi, \theta, \Psi$), and having a substrate-thickness H/λ equal to or less than 1.25; and
at least one excitation-electrode on a front surface of the quartz crystal substrate, the at least one excitation-electrode being configured to generate a plurality of plate waves,
wherein the quartz crystal substrate is cut at rotation angles in a range of $\phi=0\pm10°$, $\theta=35°$ to $40°$, $\Psi=0°\pm10°$,
wherein the vibration mode of the quartz crystal substrate is selected to be one of the plurality of plate waves having a primary temperature coefficient of frequency $\alpha\times10^{-6}/°C$. in a range of $-1.0<\alpha<+1.0$ and a secondary temperature coefficient of frequency $\beta\times10^{-8}/°C^2$ in a range of $-1.0<\beta<+1.0$ with Taylor expansion performed at 25° C. as well as having a phase velocity of 4500 m/s to 6000 m/s,
wherein the at least one excitation-electrode comprises a plurality of interdigital-transducer-electrodes comprising a plurality of electrode-fingers, and wherein an abnormal oscillation caused by an unnecessary vibration other than the vibration mode is reduced by setting a metallization ratio η in a range of 0.6<η<0.9 wherein the η is specified by a ratio of a pitch between each of the plurality of electrode-fingers to a width of one of the plurality of electrode-fingers.

5. The elastic wave device according to claim 4, further including a back-electrode configured to adjust a frequency on a rear surface of the quartz crystal substrate, and wherein an abnormal oscillation caused by an unnecessary vibration other than the vibration mode is reduced by setting a film-thickness of the back-electrode in a range of 0.001<Hb/λ<0.005.

6. The elastic wave device according to claim 4, wherein the at least one excitation-electrode comprises a plurality of interdigital-transducer-electrodes comprising a plurality of electrode-fingers, and further including a back-electrode configured to adjust a frequency on a partial rear surface of the quartz crystal substrate, the partial rear surface corresponding with an area comprising the plurality of electrode-fingers.

7. An elastic wave device, comprising:
a quartz crystal substrate cut out from a quartz crystal body having three-dimensional crystallite orientation comprised of an X-axis, a Y-axis, and a Z-axis, with both the Y-axis and the Z-axis rotated around the X-axis, the quartz crystal substrate being cut at rotation angles specified by right-handed Euler-angles ($\phi,\theta,\Psi,$) in a range of $\phi=0\pm10°$, $\theta=35°$ to $40°$, $\Psi=0°\pm10°$, the vibration mode of the quartz crystal substrate being set as a plate wave having a primary temperature coefficient of frequency $\alpha\times10^{-6}/°$ C. in a range of $-0.5<\alpha<+0.5$ and a secondary temperature coefficient of frequency $\beta\times10^{-8}/°$ C.$^2$ in a range of $-1.0<\beta<+1.0$ with Taylor expansion performed at 25° C., as well as having a phase velocity of 4500 m/s to 6000 m/s, the quartz crystal substrate having a substrate-thickness H/λ in a range of 1.00<H/λ<1.35;
wherein the elastic wave device further comprises a thin plate-like vibration-unit and a holding-unit,
wherein the vibration-unit, having an Y'-axis as a normal direction, wherein the Y'-axis represents the Y-axis after the rotation, and an X'-axis, which represents the X-axis after the rotation, comprises at least one excitation-electrode configured to generate the plate wave,
wherein the holding-unit, having the X-axis and a Z'-axis as a normal direction, having a thickness greater than the vibration-unit, and holding a periphery of the vibration-unit, is integrated with the vibration-unit,
wherein the elastic wave device obtains a vibration mode comprising at least a longitudinal wave component,
wherein the at least one excitation-electrode comprises a plurality of interdigital-transducer-electrodes comprising a plurality of electrode-fingers, and
wherein an abnormal oscillation caused by an unnecessary vibration other than the vibration mode is reduced by setting a metallization ratio η in a range of 0.6<η<0.9 wherein the η is specified by a ratio of a pitch between each of the plurality of electrode-fingers to a width of one of the plurality of electrode-fingers.

8. The elastic wave device according to claim 7, wherein the holding-unit comprises an opening in at least one direction facing the X-axis or the Z'-axis, and wherein the elastic wave device obtains the vibration mode comprising at least a longitudinal wave component.

9. The elastic wave device according to claim 7, further including a back-electrode configured to adjust a frequency on a rear surface of the quartz crystal substrate, and wherein a frequency temperature behavior of the vibration mode is adjusted by adjusting a thickness of the back-electrode.

10. The elastic wave device according to claim 7, wherein the vibration-unit and the holding-unit are formed by recessing the quartz crystal substrate in a direction of the Y'-axis.

11. The elastic wave device according to claim 7, wherein the at least one excitation-electrode comprises a plurality of interdigital-transducer-electrodes comprising a plurality of electrode-fingers, and further including a back-electrode configured to adjust a frequency on a partial rear surface of the quartz crystal substrate, the partial rear surface corresponding with an area comprising the plurality of electrode-fingers.

* * * * *